US012464795B2

(12) United States Patent
Oh et al.

(10) Patent No.: US 12,464,795 B2
(45) Date of Patent: Nov. 4, 2025

(54) METHOD OF MANUFACTURING SEMICONDUCTOR DEVICE USING SINGLE SLURRY CHEMICAL MECHANICAL POLISHING (CMP) PROCESS

(71) Applicant: Samsung Electronics Co., Ltd., Suwon-si (KR)

(72) Inventors: Joongsuk Oh, Hwaseong-si (KR); Jaeung Koo, Seoul (KR); Boun Yoon, Seoul (KR); Ilyoung Yoon, Hwaseong-si (KR); Kangchun Lee, Suwon-si (KR); Seungjae Lee, Seoul (KR); Junhwan Yim, Seoul (KR); Huiteak Hong, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 456 days.

(21) Appl. No.: 17/930,145

(22) Filed: Sep. 7, 2022

(65) Prior Publication Data

US 2023/0215926 A1  Jul. 6, 2023

(30) Foreign Application Priority Data

Jan. 6, 2022 (KR) ........................ 10-2022-0002353

(51) Int. Cl.
*H01L 29/40* (2006.01)
*H01L 21/3105* (2006.01)
(Continued)

(52) U.S. Cl.
CPC ....... *H10D 64/01* (2025.01); *H01L 21/31053* (2013.01); *H01L 21/3212* (2013.01);
(Continued)

(58) Field of Classification Search
CPC .... H10D 64/01; H10D 30/014; H10D 30/031; H10D 30/43; H10D 30/6735;
(Continued)

(56) References Cited

U.S. PATENT DOCUMENTS 8,673,707 B2  3/2014  He et al.
8,853,088 B2  10/2014  Kim et al.
(Continued)

FOREIGN PATENT DOCUMENTS

KR   100353826 B1   9/2002
KR   100578231 B1   5/2006
(Continued)

*Primary Examiner* — Tong-Ho Kim
(74) *Attorney, Agent, or Firm* — Wolf, Greenfield & Sacks, P.C.

(57) ABSTRACT

A semiconductor device manufacturing method is capable of manufacturing a semiconductor device with improved reliability, by simplifying a chemical mechanical polishing (CMP) process and minimizing a thickness distribution of a dummy gate during the CMP process. The semiconductor device manufacturing method includes forming, on a substrate, dummy gate structures extending in a first direction and spaced apart from each other in a second direction perpendicular to the first direction, each dummy gate structure including a dummy gate and a mask pattern on an upper surface of the dummy gate; forming an interlayer insulating layer covering the dummy gate structures; and performing the single slurry CMP process of removing some of the interlayer insulating layer and the dummy gate structures through the single slurry CMP process and exposing the upper surface of the dummy gate.

17 Claims, 24 Drawing Sheets

(51) Int. Cl.
*H01L 21/321* (2006.01)
*H01L 29/66* (2006.01)
*H10D 30/01* (2025.01)
*H10D 64/01* (2025.01)
*H10D 30/43* (2025.01)
*H10D 30/67* (2025.01)

(52) U.S. Cl.
CPC ......... *H10D 30/014* (2025.01); *H10D 30/031* (2025.01); *H10D 30/43* (2025.01); *H10D 30/6735* (2025.01)

(58) Field of Classification Search
CPC ............. H10D 30/6757; H10D 62/121; H10D 62/364; H10D 64/017; H10D 64/256; H10D 84/0172; H10D 84/038; H10D 84/0167; H01L 21/31053; H01L 21/3212; B82Y 10/00
USPC .......................................... 438/142
See application file for complete search history.

(56) References Cited

U.S. PATENT DOCUMENTS

| | | |
|---|---|---|
| 8,961,815 B2 | 2/2015 | Hu et al. |
| 9,870,950 B2 | 1/2018 | Hwang et al. |
| 10,541,139 B2 | 1/2020 | Nien et al. |
| 2005/0048880 A1* | 3/2005 | Tolles .................... B24B 37/30 451/5 |
| 2014/0162446 A1* | 6/2014 | Lin ...................... H10D 84/038 438/585 |
| 2015/0262812 A1* | 9/2015 | Liu ...................... H01L 21/3213 438/692 |
| 2016/0086813 A1* | 3/2016 | Kim .................. H01L 21/31053 438/197 |
| 2021/0384192 A1* | 12/2021 | Bae .................. H01L 21/76843 |

FOREIGN PATENT DOCUMENTS

| | | |
|---|---|---|
| KR | 2015-0130240 A | 11/2015 |
| KR | 2016-0035858 A | 4/2016 |
| KR | 2021-0152849 A | 12/2021 |

* cited by examiner

METHOD OF MANUFACTURING SEMICONDUCTOR DEVICE USING SINGLE SLURRY CHEMICAL MECHANICAL POLISHING (CMP) PROCESS

CROSS-REFERENCE TO RELATED APPLICATION

This application is based on and claims priority under 35 U.S.C. § 119 to Korean Patent Application No. 10-2022-0002353, filed on Jan. 6, 2022, in the Korean Intellectual Property Office, the disclosure of which is incorporated by reference herein in its entirety.

BACKGROUND

The inventive concept relates to a method of manufacturing a semiconductor device, and more particularly, to a method of manufacturing a semiconductor device using a chemical mechanical polishing (CMP) process.

As the size of a semiconductor device decreases, it is necessary to increase a degree of integration of a field effect transistor (FET) on a substrate. Accordingly, a nanosheet FET including stacked nanosheets is being developed. However, as the degree of integration of the semiconductor device increases and the size of the semiconductor device decreases to an extreme state, it is increasingly difficult to implement a required structure of the nanosheet FET. Meanwhile, the nanosheet FET may be manufactured using a replacement metal gate (RMG) process called a gate last scheme. The RMG process means a process of removing a dummy gate and replacing the dummy gate with a metal gate. Usually, the metal gate may be formed by exposing the dummy gate through a CMP process, removing the dummy gate through etching, and then, filling a part where the dummy gate is removed with a metal material.

SUMMARY

The inventive concept provides a semiconductor device manufacturing method capable of manufacturing a semiconductor device with improved reliability, by simplifying a chemical mechanical polishing (CMP) process and minimizing a thickness distribution of a dummy gate during the CMP process.

In addition, the problems to be solved by the technical spirit of the inventive concept are not limited to the problems mentioned above, and other problems may be clearly understood by those skilled in the art from the following description.

According to an aspect of the inventive concept, there is provided a method of manufacturing a semiconductor device using a single slurry chemical mechanical polishing (CMP) process including forming, on a substrate, dummy gate structures extending away from the substrate in a first direction and spaced apart from each other in a second direction perpendicular to the first direction, each dummy gate structure including a dummy gate and a mask pattern on an upper surface of the dummy gate; forming an interlayer insulating layer covering the dummy gate structures; and performing the single slurry CMP process of removing the interlayer insulating layer and some of the dummy gate structures through the single slurry CMP process and exposing the upper surface of the dummy gate, wherein, before the performing of the single slurry CMP process, a maximum thickness of the mask pattern is equal to or smaller than 85 nm, and in the performing of the single slurry CMP process, a selectivity of the mask pattern to the interlayer insulating layer is 1 to 2, and a selectivity of the interlayer insulating layer or the mask pattern to the dummy gate is equal to or greater than 50.

According to another aspect of the inventive concept, there is provided a method of manufacturing a semiconductor device using a single slurry chemical mechanical polishing (CMP) process including forming a plurality of fins on a substrate; forming dummy gate structures extending away from the substrate in a first direction across the plurality of fins on the substrate and spaced apart from each other in a second direction perpendicular to the first direction, each dummy gate structure including a dummy gate and a mask pattern on an upper surface of the dummy gate; forming source and drain regions on side surfaces of each of the dummy gate structures in the second direction; forming an interlayer insulating layer covering the dummy gate structures; performing the single slurry CMP process of removing the interlayer insulating layer and some of the dummy gate structures through the single slurry CMP process and exposing the upper surface of the dummy gate, the single slurry CMP process using only one type of slurry composition; and replacing the dummy gate with a metal gate.

According to another aspect of the inventive concept, there is provided a method of manufacturing a semiconductor device using a single slurry chemical mechanical polishing (CMP) process including forming, on a substrate, dummy gate structures extending away from the substrate in a first direction and spaced apart from each other in a second direction perpendicular to the first direction, each dummy gate structure including a dummy gate and a mask pattern on an upper surface of the dummy gate; forming an interlayer insulating layer covering the dummy gate structures; and performing a single slurry CMP process of removing a portion of the interlayer insulating layer and some of the dummy gate structures through the single slurry CMP process and exposing the upper surface of the dummy gate, wherein the single slurry CMP process is performed in three chambers, and only one type of slurry composition is used in the three chambers.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
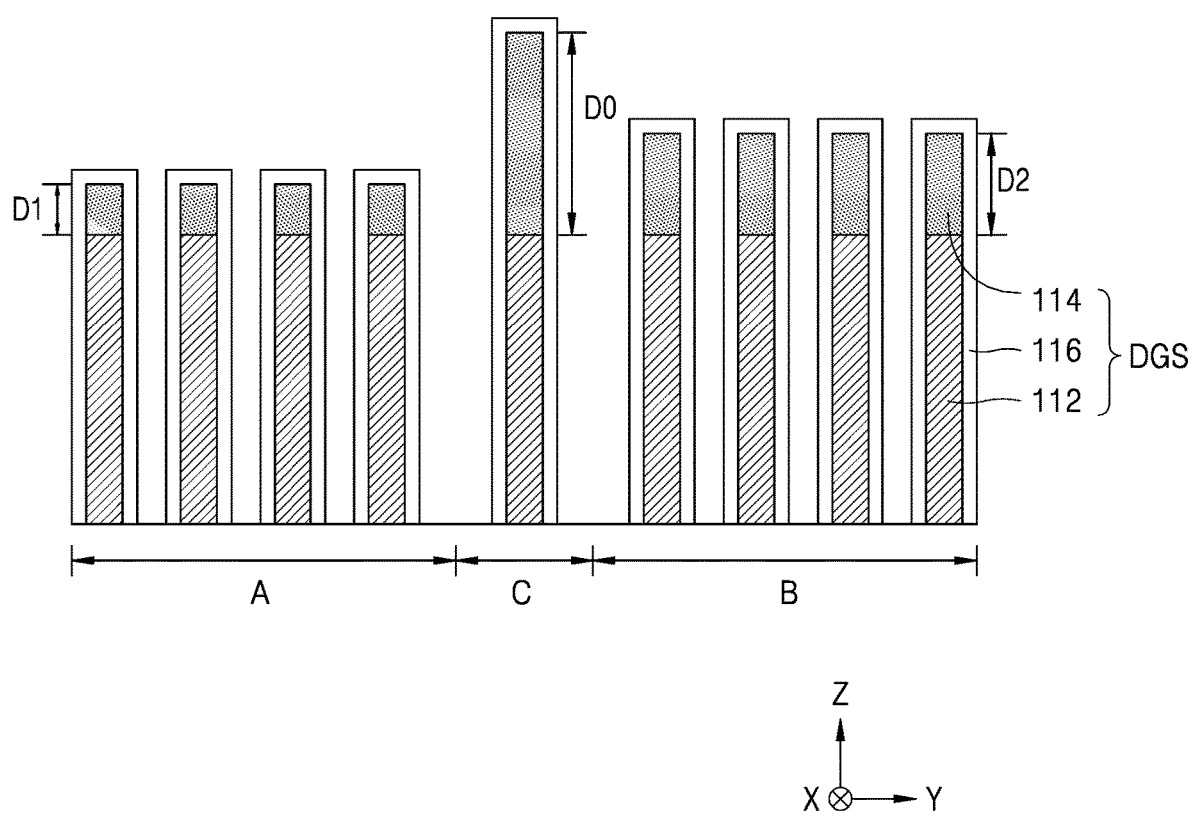
FIGS. 1 to 3 are cross-sectional views illustrating main process operations in a method of manufacturing a semiconductor device using a single slurry chemical mechanical polishing (CMP) process, according to an embodiment of the inventive concept.

Hereinafter, embodiments of the inventive concept will be described in detail with reference to the accompanying drawings. The same reference numerals are used for the same components in the drawings, and redundant descriptions thereof are omitted.

Figure 2:
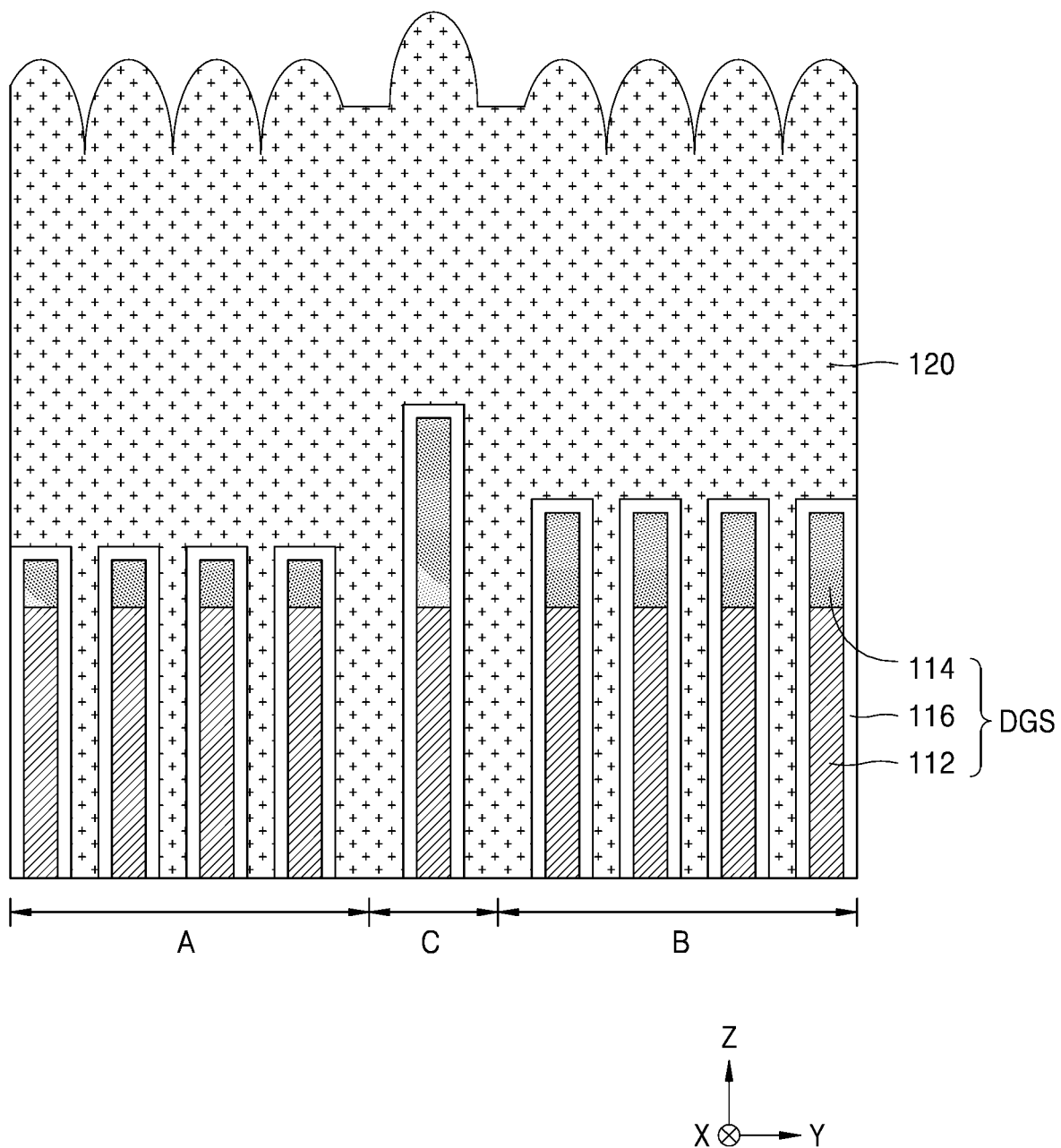
Figure 3:
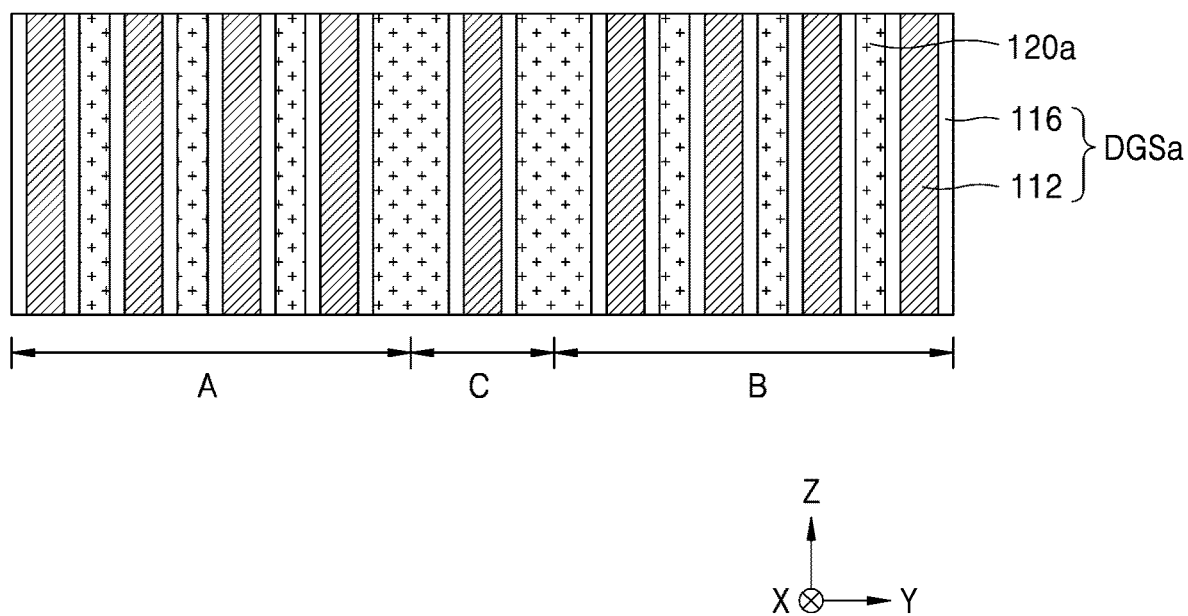

FIGS. 1 to 3 are cross-sectional views illustrating main process operations in a method of manufacturing a semiconductor device, according to an embodiment of the inventive concept.

Referring to FIG. 1, in the method of manufacturing the semiconductor device using a single slurry chemical mechanical polishing (CMP) process of the present embodiment (hereinafter, simply referred to as a 'semiconductor device manufacturing method'), first, a dummy gate structure DGS is formed on a substrate (see 102 in FIG. 7A, etc.) The dummy gate structures DGS may extend in a first direction (X direction) and may be disposed to be spaced apart from each other in a second direction (Y direction). The dummy gate structure DGS may include a dummy gate 112, a mask pattern 114, and a spacer 116. For reference, the dummy gate structure DGS may not be formed directly on the substrate 102, but may be formed on a fin (see FA of FIG. 7A) and a stack structure SS on the substrate 102. The substrate 102, the fins FA, the stack structure SS, etc. will be described in more detail with reference to FIG. 7A below. A single slurry composition is used throughout the single slurry CMP process.

The dummy gate 112 may include silicon. The dummy gate 112 may include, for example, polysilicon, amorphous silicon, or a combination thereof. In the case of polysilicon, the dummy gate 112 may be formed using chemical vapor deposition (CVD), and in the case of amorphous silicon, may be formed using sputtering, CVD, plasma deposition, etc. However, the method of forming the dummy gate 112 is not limited thereto. In the semiconductor device manufacturing method of the present embodiment, the dummy gate 112 may include, for example, polysilicon.

The mask pattern 114 and the spacers 116 may include silicon nitride (SiNx), silicon oxide ($SiO_2$), or a combination thereof. In addition, the mask pattern 114 and the spacers 116 may be formed by, for example, CVD. Meanwhile, because the mask pattern 114 and the spacer 116 need to be removed together during the CMP process, the mask pattern 114 and the spacer 116 may include a material polished under the same slurry composition and the same process conditions. For example, in the semiconductor device manufacturing method of the present embodiment, the mask pattern 114 and the spacer 116 may include SiNx.

For reference, the dummy gate 112 may be formed using the mask pattern 114. In other words, a polysilicon layer is formed on the substrate 102, and the mask pattern 114 is formed on the polysilicon layer. Thereafter, the dummy gate 112 may be formed by etching the polysilicon layer by using the mask pattern 114 as a mask. In addition, the dummy gate structure DGS may be completed by forming a spacer 116 covering the mask pattern 114 and the dummy gate 112.

Meanwhile, three regions may be defined on the substrate 102 in the second direction (Y direction). That is, as shown in FIG. 1, an NMOS region A, a PMOS region B, and an overlap region C may be defined on the substrate 102. The NMOS region A may be located on the left in the second direction (Y direction), the PMOS region B may be located on the right in the second direction (Y direction), and the overlap region C may be disposed between the NMOS region A and the PMOS region B. Here, the left and the right may be interchanged with each other as a relative concept.

For reference, the NMOS region A is a region where an NMOS transistor is formed and may include boron (B) ions in source/drain regions as impurities. In addition, the PMOS region B is a region in which the PMOS transistor is formed and may include phosphorus (P) or arsenic (As) ions in the source/drain regions as impurities. Meanwhile, during a process of forming the source/drain regions, either one of the NMOS region A and the PMOS region B may be covered by a mask, and an etching process may be performed in the other region to form the source/drain regions. In addition, a part of the mask pattern 114 in the corresponding region may be removed by the etching process, and thus a thickness of the mask pattern 114 may be reduced. During the process of forming the source/drain regions, the overlap region C may be an overlapping region covered by a mask. Accordingly, the mask pattern 114 of the overlap region C is not removed by etching, and thus the initial great thickness may be maintained.

Meanwhile, due to the purpose of improving characteristics of a transistor of each of the NMOS region A and the PMOS region B, and/or due to a size difference between the transistors of the NMOS region A and the PMOS region B, etching amounts of the mask patterns 114 of the NMOS region A and the PMOS region B may be different from each other during the process of forming the source/drain regions. Accordingly, thicknesses of the mask patterns 114 of the NMOS region A and the PMOS region B may be different from each other. For example, in the case of a nanosheet FET, the size of an NMOS transistor may be large and the size of a PMOS transistor may be small. Accordingly, during the process of forming the source/drain regions, the etching amount of the NMOS region A may be greater than the etching amount of the PMOS region B. As a result, the mask pattern 114 of the NMOS region A may be etched relatively much, and the thickness of the mask pattern 114 of the NMOS region A may be less than the thickness of the mask pattern 114 of the PMOS region B.

More specifically, in the case of the nanosheet FET, as the size of the nanosheet FET becomes fine, a width of the dummy gate 112 also becomes fine, and accordingly, the thickness of the mask pattern 114 for forming the dummy gate 112 is gradually smaller. For example, the thickness of the mask pattern 114 for forming the dummy gate 112 may be equal to or smaller than 85 nm. Accordingly, in FIG. 1, the mask pattern 114 of the overlap region C may have a basic thickness D0, which is a thickness that is not etched during the process of forming the source/drain regions. The basic thickness D0 may be, for example, equal to or less than 85 nm. Meanwhile, during the process of forming the source/drain regions, the mask pattern 114 of the NMOS region A may have a first thickness D1 as a relatively large amount of the mask pattern 114 is etched. The first thickness D1 may be, for example, equal to or less than 30 nm. In addition, during the process of forming the source/drain regions, the mask pattern 114 of the PMOS region B may have a second thickness D2 as a relatively small amount of the mask pattern 114 is etched. The second thickness D2 may be, for example, greater than 30 nm and smaller than 85 nm. Accordingly, the thickness of the mask pattern 114 may be such that the thickness of the mask pattern 114 decreases from of the overlap region C, the PMOS region B, and the NMOS region A. That is, the thickness of the mask pattern 114 is the greatest in the overlap region C, is reduced in the PMOS region B, and is reduced even further in the NMOS region A. Also, a thickness difference between the mask pattern 114 of the overlap region C and the mask pattern 114 of the NMOS region A may be equal to or greater than 50 nm. Meanwhile, when the lower dummy gates 112 have the same height, a step difference between the mask pattern 114 of the overlap region C and the mask patterns 114 of the NMOS region A may be equal to or greater than 50 nm.

Referring to FIG. 2, after the dummy gate structure DGS is formed, an interlayer insulating layer 120 covering the dummy gate structure DGS is formed. The interlayer insulating layer 120 may include, for example, $SiO_2$, SiNx, or a combination thereof. The interlayer insulating layer 120 may be formed using, for example, flowable oxide (FOX), undoped silica glass (USG), borosilicate glass (BSG), high density plasma (HDP), plasma enhanced oxide (PEOX), or flowable CVD (FCVD). In the semiconductor device manufacturing method of the present embodiment, the interlayer insulating layer 120 may include, for example, $SiO_2$.

As shown in FIG. 2, a protrusion structure, that is, a bump, may be formed on an upper surface of the interlayer insulating layer 120 to correspond to the dummy gate structure DGS. Meanwhile, the height of the dummy gate structure DGS of the overlap region C is the greatest, and accordingly, the bump of the overlap region C may protrude the highest. Due to the high bump structure of the overlap region C, the overlap region C is sometimes referred to as a bump region.

As described above, a semiconductor device of a gate last scheme may perform a process of removing the mask pattern 114 and exposing the dummy gate 112 for a replacement metal gate (RMG) process. For example, a CMP process may be performed to expose the dummy gate 112. In addition, for the CMP process, before the CMP process, as shown in FIG. 2, the interlayer insulating layer 120 may be formed.

Referring to FIG. 3, after the interlayer insulating layer 120 is formed, a part of the interlayer insulating layer 120 and the mask pattern 114 may be removed through the CMP process to expose the upper surface of the dummy gate 112. Meanwhile, when the mask pattern 114 is removed, a part of the spacer 116 surrounding the mask pattern 114 may also be removed. After the upper surface of the dummy gate 112 is exposed through the CMP process, an upper surface of a dummy gate structure DGSa, for example, the upper surface of the dummy gate 112, may be substantially coplanar with an upper surface of an interlayer insulating layer 120*a*. Also, the dummy gate structure DGSa for the RMG process may be formed by removing the part of the mask pattern 114 and the spacer 116.

In the semiconductor device manufacturing method of the present embodiment, a one step CMP process may be used to expose the dummy gate 112. Here, the one step may mean performing a process while maintaining one process condition. For example, in the case of the CMP process, the one step may mean that the CMP process is performed using only one type of slurry composition without changing the slurry composition. The single slurry CMP process will be described in more detail with reference to FIGS. 4A and 4B.

Meanwhile, during the single slurry CMP process of the semiconductor device manufacturing method of the present embodiment, the slurry composition may have the following characteristics.

A selectivity of an SiNx film to an $SiO_2$ film by the slurry composition may be 1:1 to 2:1. In other words, with respect to the slurry composition, the selectivity of the SiNx film to the $SiO_2$ film may be 1 to 2. In the semiconductor device manufacturing method of the present embodiment, for example, the selectivity of the SiNx film to the $SiO_2$ film in the slurry composition may be substantially 1. Meanwhile, the selectivity of the SiNx film (or $SiO_2$ film) to a polysilicon film by the slurry composition may be equal to or greater than 50:1. In other words, with respect to the slurry composition, the selectivity of the SiNx film (or $SiO_2$ film) to the polysilicon film may be equal to or greater than 50.

In the semiconductor device manufacturing method of the inventive concept, due to the slurry composition having the selectivity characteristics described above, during the single slurry CMP process, the interlayer insulating layer 120 including a material of $SiO_2$, and the mask pattern 114 and the spacer 116 including a material of SiNx may be etched at a similar rate. In contrast, the dummy gate 112 including polysilicon may be hardly etched. Accordingly, during the single slurry CMP process, the dummy gate 112 may act as an etch stop, and the upper surface of the dummy gate 112 may correspond to an end-point of the CMP process.

For reference, in general, the selectivity may be adjusted by adjusting a mixing ratio of the slurry composition. In the semiconductor device manufacturing method of the present embodiment, the slurry composition may include, for example, an abrasive, an SiNx film polishing accelerator, a polysilicon film polishing inhibitor, an $SiO_2$ film polishing regulator, a pH regulator, and a solvent of a residual amount.

The abrasive may include a metal oxide, such as silica ($SiO_2$), alumina ($Al_2O_3$), ceria ($CeO_2$), zirconia ($ZrO_2$), titania ($TiO_2$), etc. In the semiconductor device manufacturing method of the present embodiment, the abrasive may be ceria. Meanwhile, the abrasive may include content of 0.01 wt % to 1 wt %, with respect to the total weight of the slurry composition.

The SiNx film polishing accelerator and the polysilicon film polishing inhibitor may increase a polishing speed of the SiNx film and the $SiO_2$ film and suppress a polishing speed of the polysilicon film by interaction between the SiNx film polishing accelerator and the polysilicon film polishing inhibitor. The SiNx film polishing accelerator may include at least one of Isoleucine, Alanine, Glycine, Glutamine, Threonine, Serine, Asparagine, Tyrosine, Cysteine, Valine, and Leucine. In addition, the SiNx film polishing accelerator may include content of 0.01 to 10 wt % with respect to the total weight of the slurry composition.

The polysilicon film polishing inhibitor may include at least one of an anionic polymer including at least one of polyvinyl alcohol (PVA), ethylene glycol (EG), glycerin, polyethylene glycol (PEG), polypropylene glycol (PPG), and polyvinyl pyrrolidone (PVP), a nonionic polymer including at least one of polyacrylic acid, polyacrylic acid ammonium salt, polymethacrylic acid, polyammonium methacrylic acid salt, and polyacrylic maleic acid, and a fluorine-based surfactant including at least one of an alkyl sodium sulfonate fluorosurfactant, polyoxyethylene fluorosurfactant, and nonionic ethoxylated fluorosurfactant. In addition, the polysilicon film polishing inhibitor may include content of 0.0001 wt % to 1 wt % with respect to the total weight of the slurry composition. In the semiconductor device manufacturing method of the present embodiment, the polysilicon film polishing inhibitor may include content of 0.01 wt % to 0.5 wt % with respect to the total weight of the slurry composition.

The $SiO_2$ film polishing regulator may include at least one of 1-2-hydroxyethyl-2-pyrrolidone, 4-hydroxyethyl-2-pyrrolidone, maleic anhydride, maleic hydrazide, and malemide. In addition, the $SiO_2$ film polishing regulator may include content of 0.01 wt % to 10 wt % with respect to the total weight of the slurry composition.

The pH regulator may include at least one of alkaline solutions such as potassium hydroxide, sodium hydroxide, magnesium hydroxide, rubidium hydroxide, cesium hydroxide, sodium hydrogen carbonate, sodium carbonate, triethanolamine, tromethamine, niacinamide, etc. and/or acid solutions such as nitric acid, sulfuric acid, phosphoric acid, hydrochloric acid, acetic acid, citric acid, glutaric acid, glucolic acid, formic acid, lactic acid, malic acid, malonic acid, maleic acid, oxalic acid, phthalic acid, succinic acid, tartaric acid, etc. Meanwhile, the pH of the slurry composition may be about 5 to about 10. In the semiconductor device manufacturing method of the present embodiment, the pH of the slurry composition may be about 6 to about 8. In addition, when ceria is included as the abrasive, a negative zeta potential may be implemented in a neutral region. When the pH of the slurry composition is inappropriate, the pH may be regulated using the pH regulator.

The solvent may include deionized water. The solvent is a solvent in relation to a material that is completely dissolved in a solvent, such as the SiNx film polishing accelerator and/or the polysilicon film polishing inhibitor, but may serve as a dispersion medium in relation to a fine metal particle, such as the abrasive. In other words, the solvent may serve as simultaneously a solvent and a dispersion medium.

Meanwhile, in the semiconductor device manufacturing method of the present embodiment, polishing particles of the polisher may have a very small size. For example, polishing particles of the polisher may have a size of 10 nm to 3 nm, and may have a size equal to or less than 3 nm according to an embodiment. Here, the size may correspond to a diameter when the polisher particles are assumed to be spherical. As described above, the polisher particles of a small size may be used, thereby preventing defects, such as a surface scratch.

In the semiconductor device manufacturing method of the present embodiment, the upper surface of the dummy gate 112 may be exposed by removing a part of the interlayer insulating layer 120 and the mask pattern 114, through the single slurry CMP process using one type of slurry composition. In addition, the upper surface of the dummy gate 112 may be exposed through the single slurry CMP process, thereby simplifying the CMP process, and stably performing the CMP process regardless of a pattern density and a state of the mask pattern 114, for example, the thickness of the mask pattern 114. For example, the upper surface of the dummy gate 112 may be exposed through the single slurry CMP process, thereby minimizing polysilicon loss of the dummy gate 112 and thickness distribution of the dummy gate 112. As a result, according to the semiconductor device manufacturing method of the present embodiment, a reliable semiconductor device may be manufactured based on the single slurry CMP process.

Figure 4A:
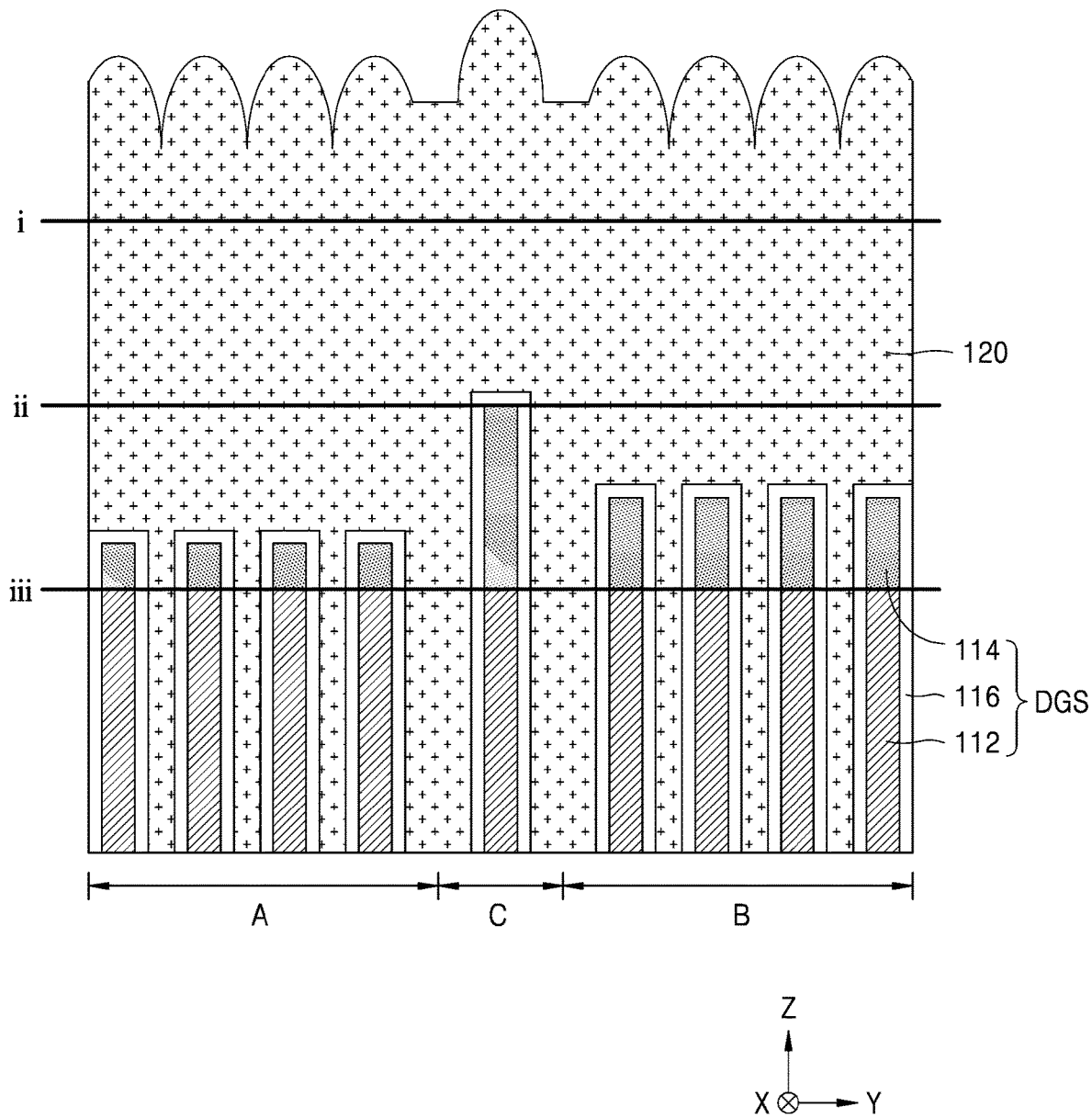
FIGS. 4A and 4B are a cross-sectional view and a conceptual diagram in more detail illustrating an operation of performing a single slurry CMP process of FIG. 3.
Figure 4B:
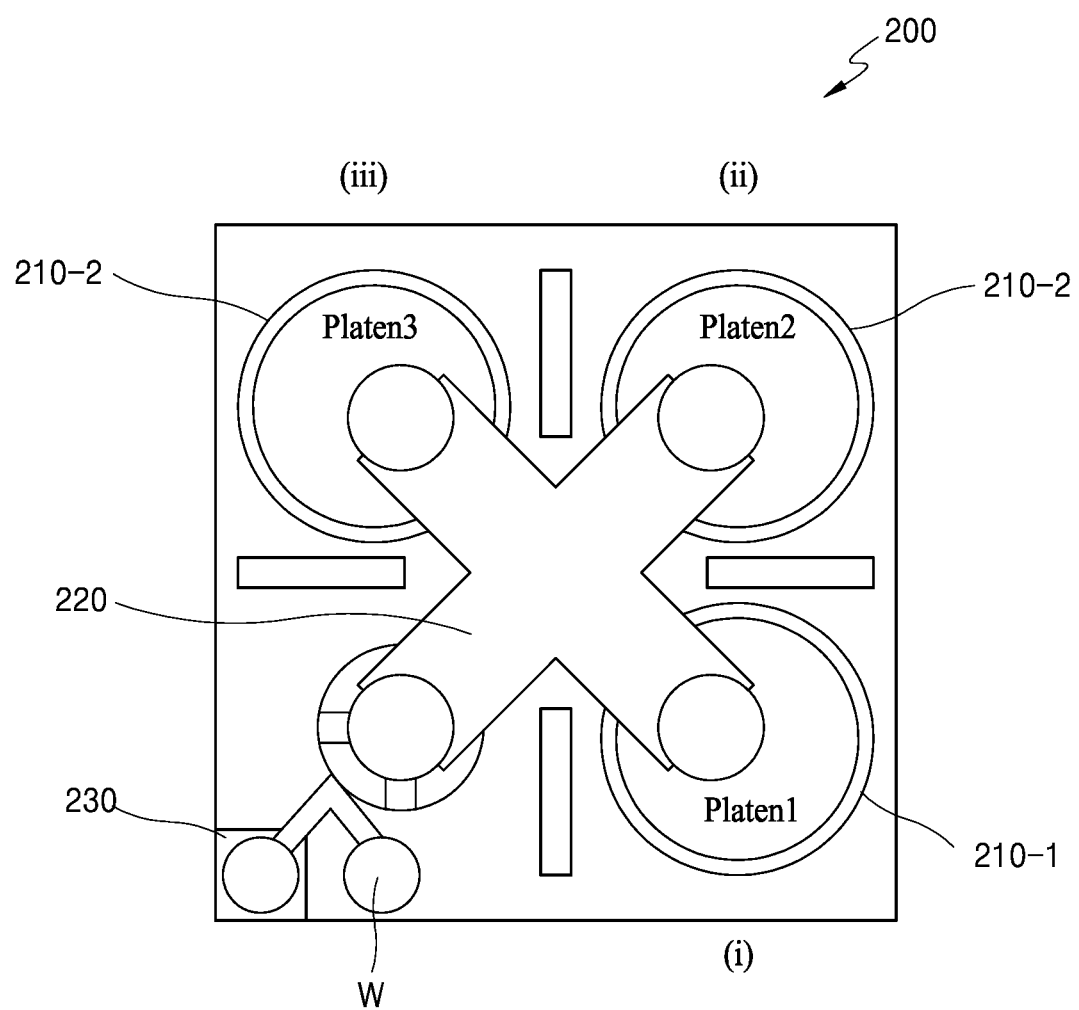

FIGS. 4A and 4B are a cross-sectional view and a conceptual diagram in more detail illustrating an operation of performing a single slurry CMP process of FIG. 3. The redundant descriptions with those given with reference to FIGS. 1 to 3 are briefly given or omitted.

Referring to FIGS. 4A and 4B, in a semiconductor device manufacturing method according to the present embodiment, the single slurry CMP process may be performed by a CMP apparatus 200 through three processes. For example, the single slurry CMP process may include a first process of removing a portion of the interlayer insulating layer 120, a second process of exposing an upper surface of the mask pattern 114 of the overlap region C by removing an additional portion of the interlayer insulating layer 120, and a third process of exposing an upper surface of the dummy gate 112 by removing another portion of the interlayer insulting layer 120. FIG. 4A shows a first line i corresponding to an end-point of the first process, a second line ii corresponding to an end-point of the second process, and a third line iii corresponding to an end-point of the third process. Meanwhile, as described above, CMP may be performed using one type of slurry composition in the first process to the third process.

Meanwhile, the CMP process may usually be performed by the CMP apparatus 200 including three chambers, for example, first to third chambers 210-1 to 210-3, as shown in FIG. 4B. For example, the first process may be performed by the first chamber 210-1, the second process may be performed by the second chamber 210-2, and the third process may be performed by the third chamber 210-3. In addition, according to an embodiment, due to the use of one type of slurry composition, the first process to the third process may be performed by one chamber.

For reference, a chamber is also referred to as a platen due to its form. Therefore, the first chamber 210-1 may correspond to a first platen, the second chamber 210-2 may correspond to a second platen, and the third chamber 210-3 may correspond to a third platen. Meanwhile, in the CMP apparatus 200, a wafer transfer apparatus 220 may transfer a wafer W, and the wafer W may stand by a wafer standby unit 230. More specifically, the wafer transfer apparatus 220 may move the wafer W of the wafer standby unit 230 to the first chamber 210-1, or may move the wafer W of the third chamber 210-3 to the wafer standby unit 230. Furthermore, the wafer transfer apparatus 220 may move the wafer W between adjacent chambers.

The semiconductor device manufacturing method of the present embodiment may include, for example, a method of manufacturing a gate all around FET (GAAFET). Here, the GAAFET refers to a FET having a structure that surrounds four sides of a channel region, and may include a nanosheet FET described with reference to FIGS. 7A to 17B. Recently, in accordance with a process miniaturization of the GAAFET, a mask pattern of a small thickness is formed in order to pattern a dummy gate of a small pitch. For example, the thickness of the mask pattern for patterning the dummy gate is equal to or less than of 85 nm. In addition, in a GAAFET structure, as an amount of etching increases during a process of forming source/drain regions, a part of the mask pattern is also etched, and thus the thickness is further smaller, and a step difference between mask patterns also increases. For example, the minimum thickness of the mask patterns is equal to or less than 30 nm, and the step difference between the mask patterns is increasingly equal to or greater than 50 nm.

Meanwhile, the dummy gate may be opened by performing a two-step CMP process. The two-step CMP process may include at least two slurry compositions. In the case of such a two-step CMP process, in a first step, the CMP process may be performed with a slurry composition having a selectivity close to $SiO_2$ film:SiNx film=1:1, and in a second step, the CMP process may be performed with a slurry composition that minimizes etching of polysilicon of the dummy gate. For example, in the case of the two-step CMP process with respect to the existing finFET, in the first step, a first CMP of opening the upper surface of the mask pattern is performed and then, a second CMP is performed to leave the thickness of about 30 nm of the mask pattern. Thereafter, in the second step, a third CMP of opening the dummy gate is performed while minimizing etching of polysilicon by changing the slurry composition.

However, as described above, in accordance with miniaturization of the GAAFET process, because the thickness of the mask pattern is already too small before the CMP process, and the step difference between the mask patterns increases, there is a limit to managing a thickness distribution of the dummy gate by the two-step CMP process. For example, in the case of recent GAAFET products, polysilicon loss of several nm or less and the thickness distribution of dummy gate of several nm or less are required. When applying the second step CMP process to the GAAFET structure, it is difficult to meet such a demand.

In contrast, in the semiconductor device manufacturing method of the present embodiment, the dummy gate 112 may be opened through the single slurry CMP process using one type of slurry composition. Accordingly, the semiconductor device manufacturing method according to the present embodiment may sufficiently satisfy the requirements of the polysilicon loss thickness and the thickness distribution of the dummy gate during the process of opening the dummy gate 112.

In addition, in the semiconductor device manufacturing method of the present embodiment, the single slurry CMP process may perform excess polishing in order to open all the dummy gates 112. Here, excess polishing may mean that polishing is continued even after the upper surface of the dummy gate 112 is opened, that is, the end-point is reached. As such, the reason for excess polishing may be to prevent not opening of some dummy gates 112 due to a difference in height between the dummy gates or a difference in thickness of an upper mask pattern. For example, in the semiconductor device manufacturing method of the present embodiment, an excess polishing time may be about 20% of a main polishing time. The excess polishing time is not limited to 20% of the main polishing time.

Meanwhile, in the semiconductor device manufacturing method of the present embodiment, because the single slurry CMP process is performed using a slurry composition in which selectivity of the SiNx film or the $SiO_2$ film to the polysilicon film is equal to or greater than 50, even if excess polishing is performed, problems of loss of polysilicon, dishing of the interlayer insulating layer 120, melting of the spacer 116 may hardly occur. In addition, by using a fine-sized abrasive, a surface scratch may not occur. Furthermore, based on the single slurry CMP process, the process is simplified, and the process of changing of the slurry composition and an intermediate cleaning process are omitted, which may be advantageous in terms of unit per equipment hour (UPEH).

Figure 5:
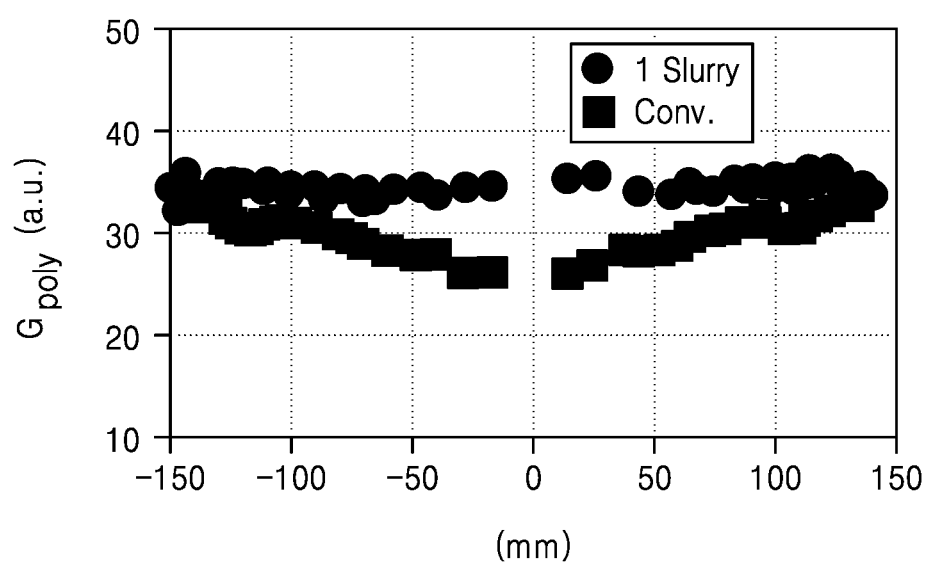
FIG. 5 is a graph showing a thickness distribution of a dummy gate after a CMP process, in a semiconductor device manufacturing method of an embodiment of the inventive concept and a semiconductor device manufacturing method of a comparative example.

FIG. 5 is a graph showing a thickness distribution of a dummy gate after a CMP process, in a semiconductor device manufacturing method to an embodiment of the inventive concept and a semiconductor device manufacturing method of a comparative example. "1Slurry" in FIG. 5 corresponds to the semiconductor device manufacturing method of the present embodiment, and "Conv." corresponds to the semiconductor device manufacturing method of the comparative example. In the graph, the x-axis may represent a location in both directions from the center of a wafer, the y-axis may represent the thickness of the dummy gate, and a unit is an arbitrary unit (a.u.).

Referring to FIG. 5, as may be seen from the graph, it may be confirmed that the thickness of the dummy gate is maintained uniform to some extent after the CMP process in the semiconductor device manufacturing method (1Slurry) according to the present embodiment. Meanwhile, in the semiconductor device manufacturing method of the comparative example (Conv.), it may be seen that the thickness of the dummy gate is not uniform after the CMP process. For example, in the semiconductor device manufacturing method (Conv.) of the comparative example, the thickness of the dummy gate is smaller in the center of the water, which, in the CMP process, may be due to a lot of loss of polysilicon of the dummy gate in the center of the water. Meanwhile, in the semiconductor device manufacturing method (Conv.) of the comparative example, the CMP process may be the two-step CMP process described above.

Figure 6A:
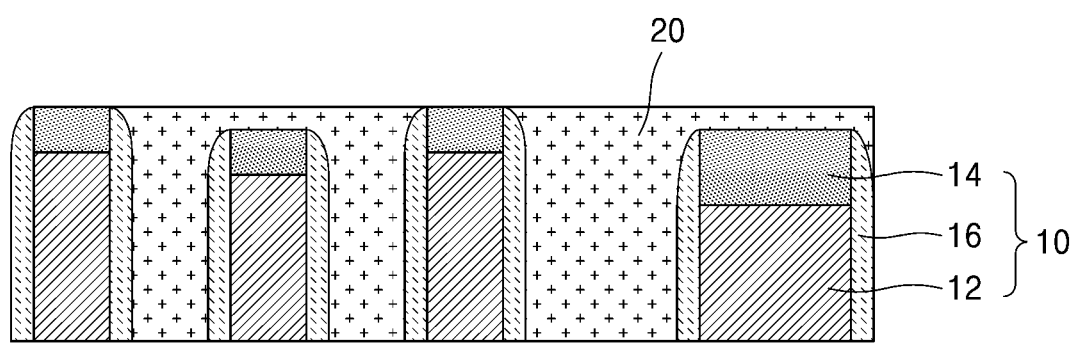
FIGS. 6A to 6B are cross-sectional views illustrating problems in a semiconductor device manufacturing method of a comparative example.
Figure 6B:
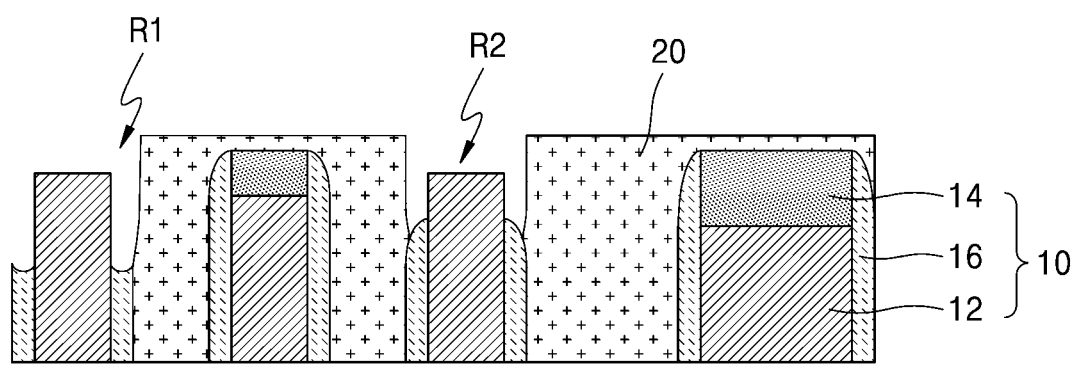

FIGS. 6A to 6B are cross-sectional views illustrating problems in a semiconductor device manufacturing method of a comparative example.

Referring to FIGS. 6A and 6B, in the semiconductor device manufacturing method of the comparative example, after the mask pattern 14 of the dummy gate structure 10 is opened through a CMP process, in order to remove the mask pattern 14, SiNx etch-back may be used. However, when etch-back is used, as may be seen from FIG. 6B, in the case of the dummy gate structure 10 in which the upper surface of the mask pattern 14 is not opened, a problem in that the mask pattern 14 is not removed may occur. In addition, even in the case of the dummy gate structure 10 that is opened, the spacers 16 are excessively etched, which may cause recesses R1 and R2. When the spacer 16 is excessively etched to generate the recesses R1 and R2, the upper surface of the spacer 16 is lower than the upper surface of the dummy gate 12, which may cause a defect in a subsequent RMG process for the GAAFET. However, as described above, in the case of the semiconductor device manufacturing method of the present embodiment, by using the single slurry CMP process, the problem of melting of the spacer does not occur, and accordingly, the problem of generating spacer recesses may be prevented.

FIGS. 7A to 17B are cross-sectional views illustrating a process of a semiconductor device manufacturing method according to an embodiment of the inventive concept. The redundant descriptions with those given with reference to FIGS. 1 to 6B are briefly given or omitted.

Figure 7A:
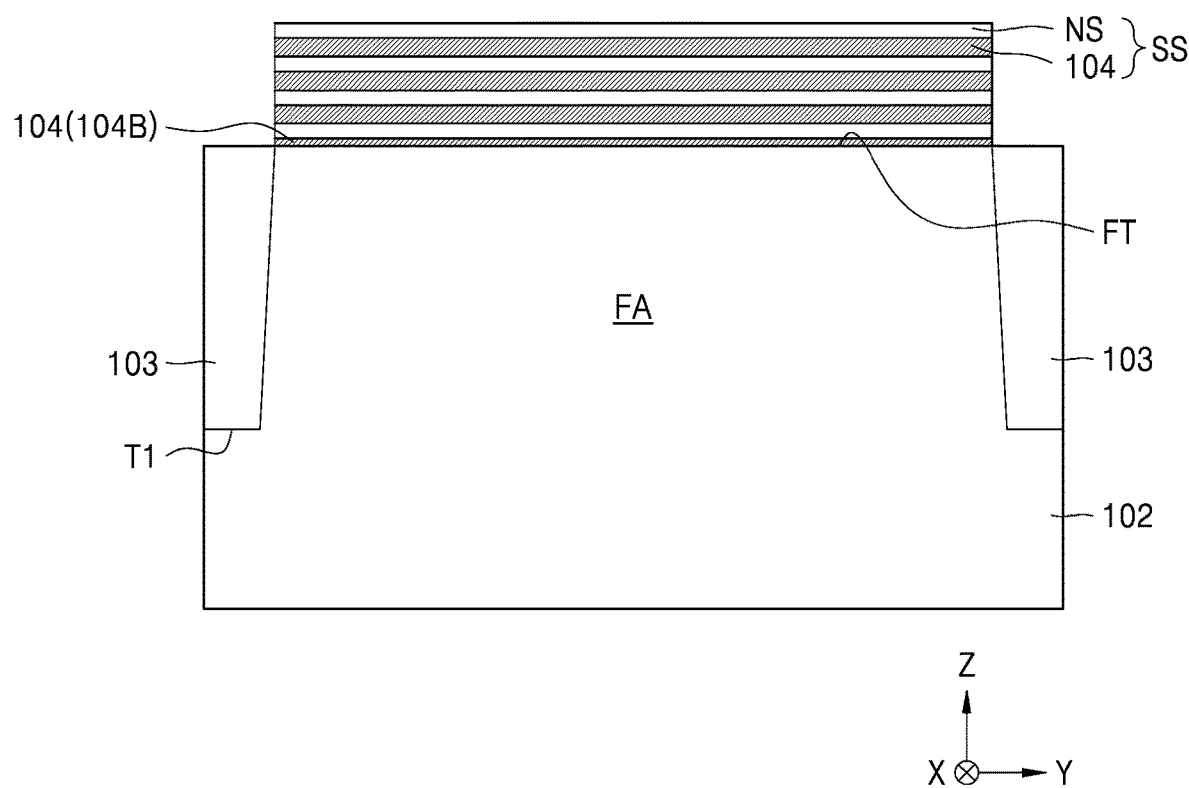
FIGS. 7A to 17B are cross-sectional views illustrating a process of a semiconductor device manufacturing method according to an embodiment of the inventive concept.
Figure 7B:
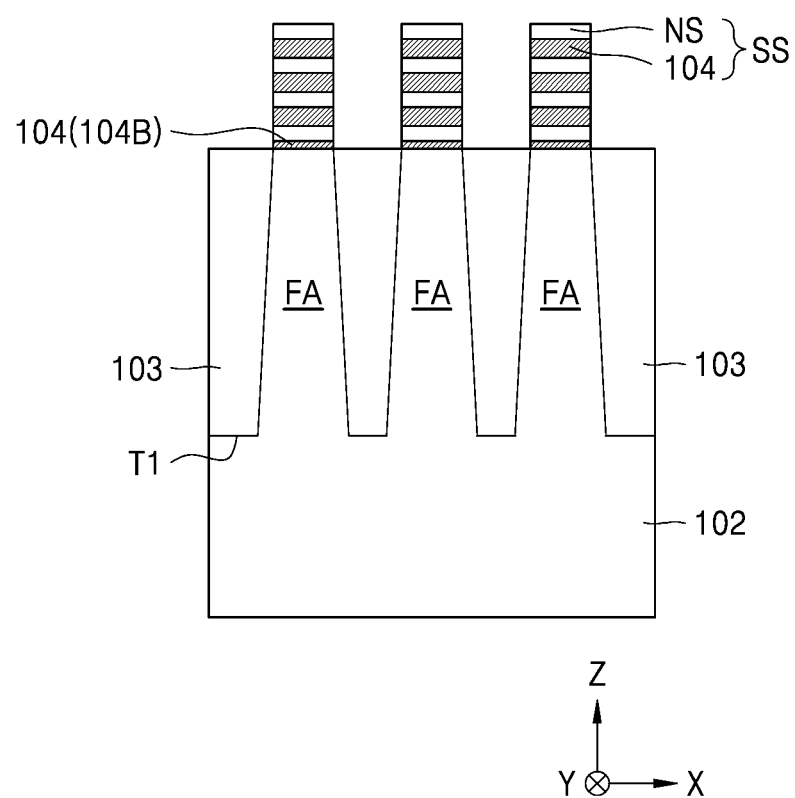

Referring to FIGS. 7A and 7B, in the semiconductor device manufacturing method of the present embodiment, first, a stack structure SS, in which sacrificial semiconductor layers 104 and nanosheets NS are alternately stacked on a substrate 102, is formed. A height of a sacrificial semiconductor layer 104B closest to the substrate 102 may be less than heights of the other sacrificial semiconductor layers 104. For example, in the semiconductor device manufacturing method of the present embodiment, the height of the sacrificial semiconductor layer 104B closest to the substrate 102 may be less than or equal to ½ of the height of the other sacrificial semiconductor layers 104. Here, the substrate 102 may include a semiconductor, such as Si or Ge, or a compound semiconductor, such as SiGe, SiC, GaAs, InAs, or InP. However, a material of the substrate 102 is not limited to the materials described above.

Meanwhile, as described with reference to FIG. 1, an NMOS region A, a PMOS region B, and the overlap region C may be defined on the substrate 102. In addition, in the following figures including FIGS. 7A and 7B, a region on the substrate 102 may be the NMOS region A or the PMOS region B. In the case of the NMOS region A, boron (B) ions may be included as impurities in a subsequent process of forming the source/drain regions 130 of FIG. 12. In addition, in the case of the PMOS region B, phosphorus (P) or arsenic (As) ions may be included as impurities in the subsequent process of forming the source/drain regions 130 of FIG. 12.

The sacrificial semiconductor layer 104 and the nanosheet NS may include different semiconductor materials. For example, the sacrificial semiconductor layer 104 may include SiGe, and the nanosheet NS may include Si. Each of the sacrificial semiconductor layers 104 may include the same material or different materials. For example, each of the sacrificial semiconductor layers 104 includes a SiGe film, and a Ge content ratio of the sacrificial semiconductor layer 104B closest to the substrate 102 and a Ge content ratio of the other sacrificial semiconductor layers 104 may be different from each other.

Subsequently, mask patterns are formed on the stack structure SS, and the stack structure SS and a part of the substrate 102 are etched using the mask pattern as an etching mask to form a trench T1. The mask patterns may extend in the second direction (Y direction) and may be spaced apart from each other in the first direction (X direction). Through the formation of the trench T), a plurality of fins FA defined by the trench T1 may be formed. Meanwhile, the corresponding stack structure SS may be disposed on an upper portion of each of the fins FA.

Thereafter, the trench T1 is filled with an insulating material and forms a device isolation film 103. The device isolation film 103 may include, for example, $SiO_2$. Thereafter, the mask pattern may be removed and a part of an upper portion of the device isolation film 103 may be removed through a recess process. After the recess process, an upper surface of the device isolation film 103 may be substantially the same as an upper surface FT of each of the fins FA.

Figure 8A:
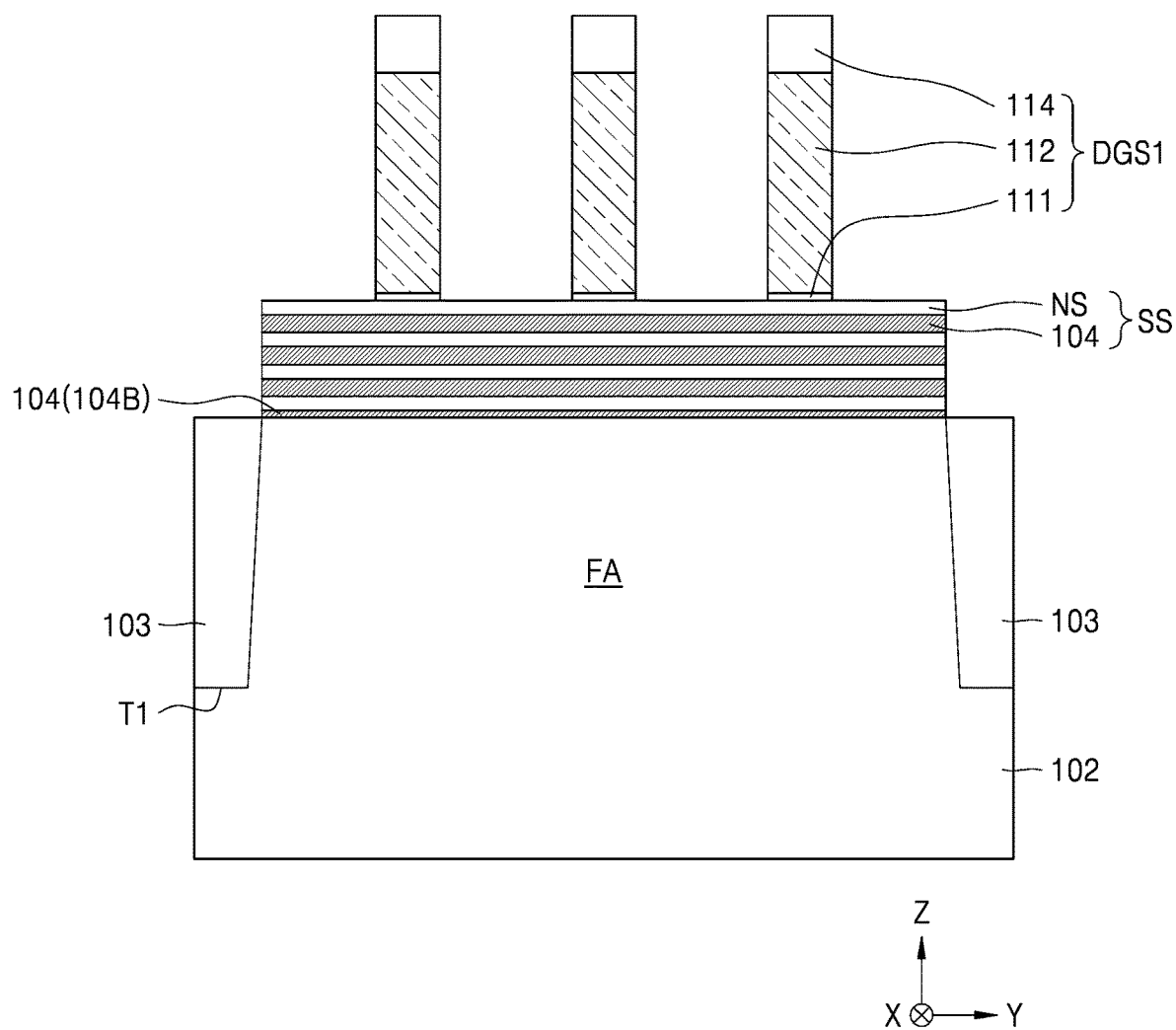
Figure 8B:
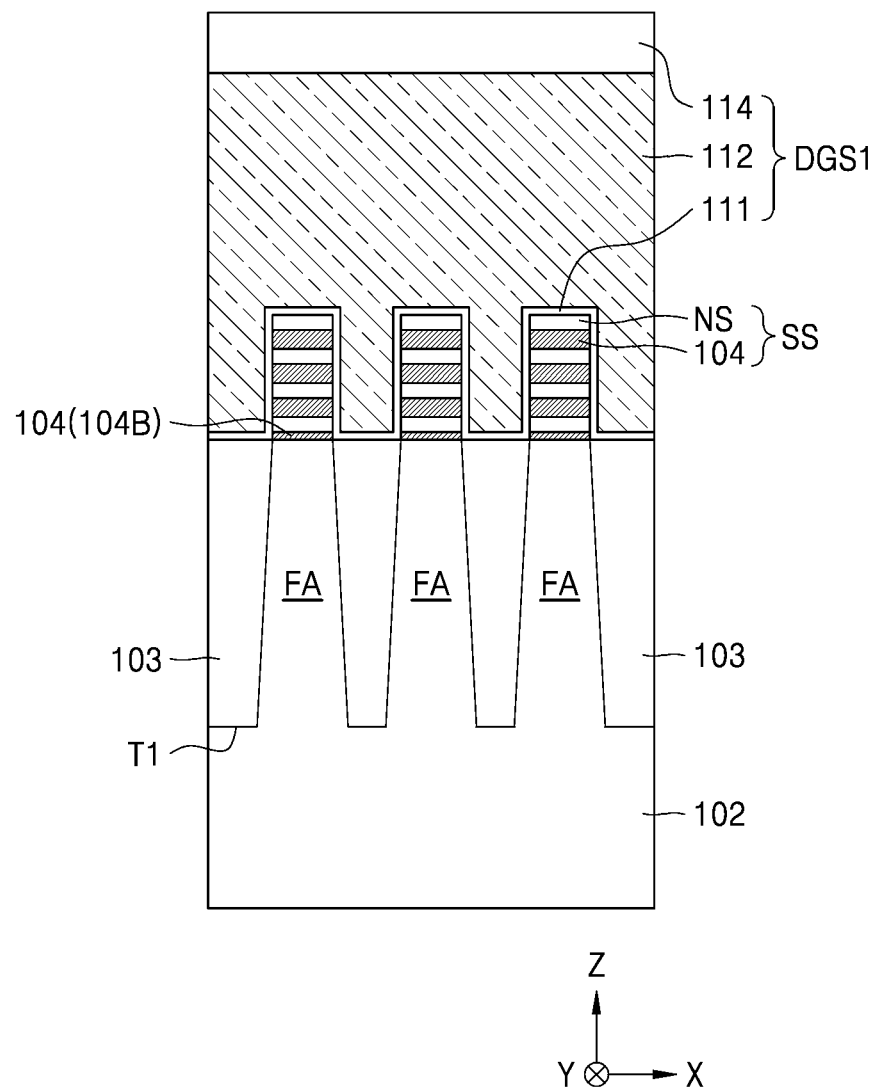

Referring to FIGS. 8A and 8B, a plurality of dummy gate structures DGS1 are formed on the fins FA on the substrate 102. Dummy gate structures DGS1 may extend across the fins FA, and may cover an upper surface and a side surface of a part of the stack structure SS. For example, the dummy gate structure DGS1 may extend in the first direction (X direction) and may be spaced apart from each other in the second direction (Y direction). The dummy gate structure DGS1 may include an insulating layer 111, a dummy gate 112, and a mask pattern 114. In the semiconductor device manufacturing method of the present embodiment, the dummy gate 112 may include polysilicon, and the mask pattern 114 may include SiNx.

Figure 9:
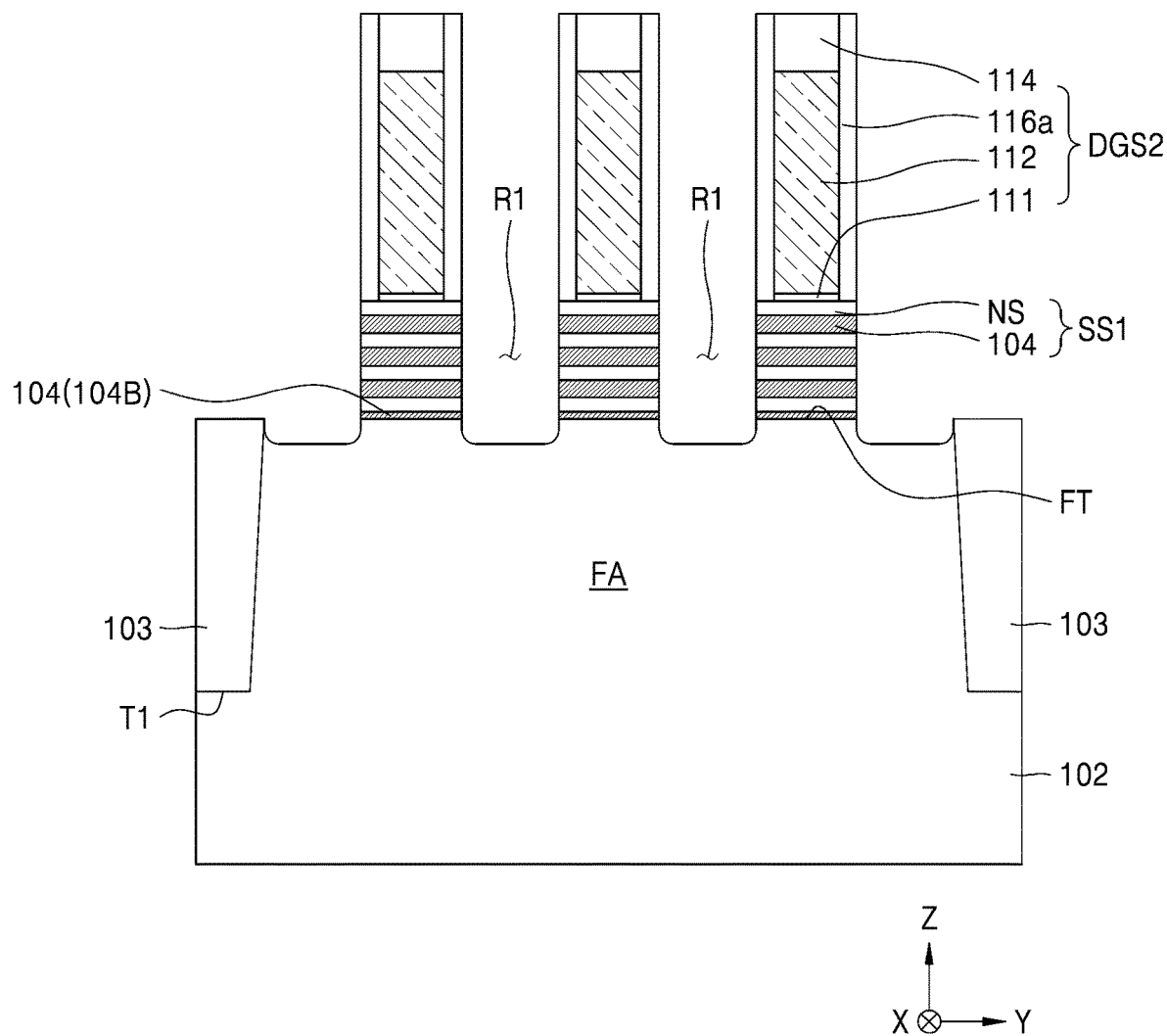

Referring to FIG. 9, first spacers 116a covering sidewalls of the dummy gate structure DGS1 are formed. The first spacer 116a may be formed as a single layer or multiple layers including SiNx, SiCN, SiBN, SiON, SiOCN, SiBCN, SiOC, $SiO_2$, or a combination thereof. For example, in the semiconductor device manufacturing method of the present embodiment, the first spacer 116a may include SiNx. The dummy gate structure DGS2 may include the first spacer 116a. A part of the stack structure SS is etched using the dummy gate structure DGS2 as an etch mask to open the upper surface FT of the fin FA. The recess region R1 may be formed through a process of opening the upper surface FT of the fin FA. A level of a bottom surface of the recess region R1 may be lower than a level of the upper surface FT of the fin FA. Through the recess region R1, the stack structure SS may be divided into a plurality of stack structures SS1.

Figure 10:
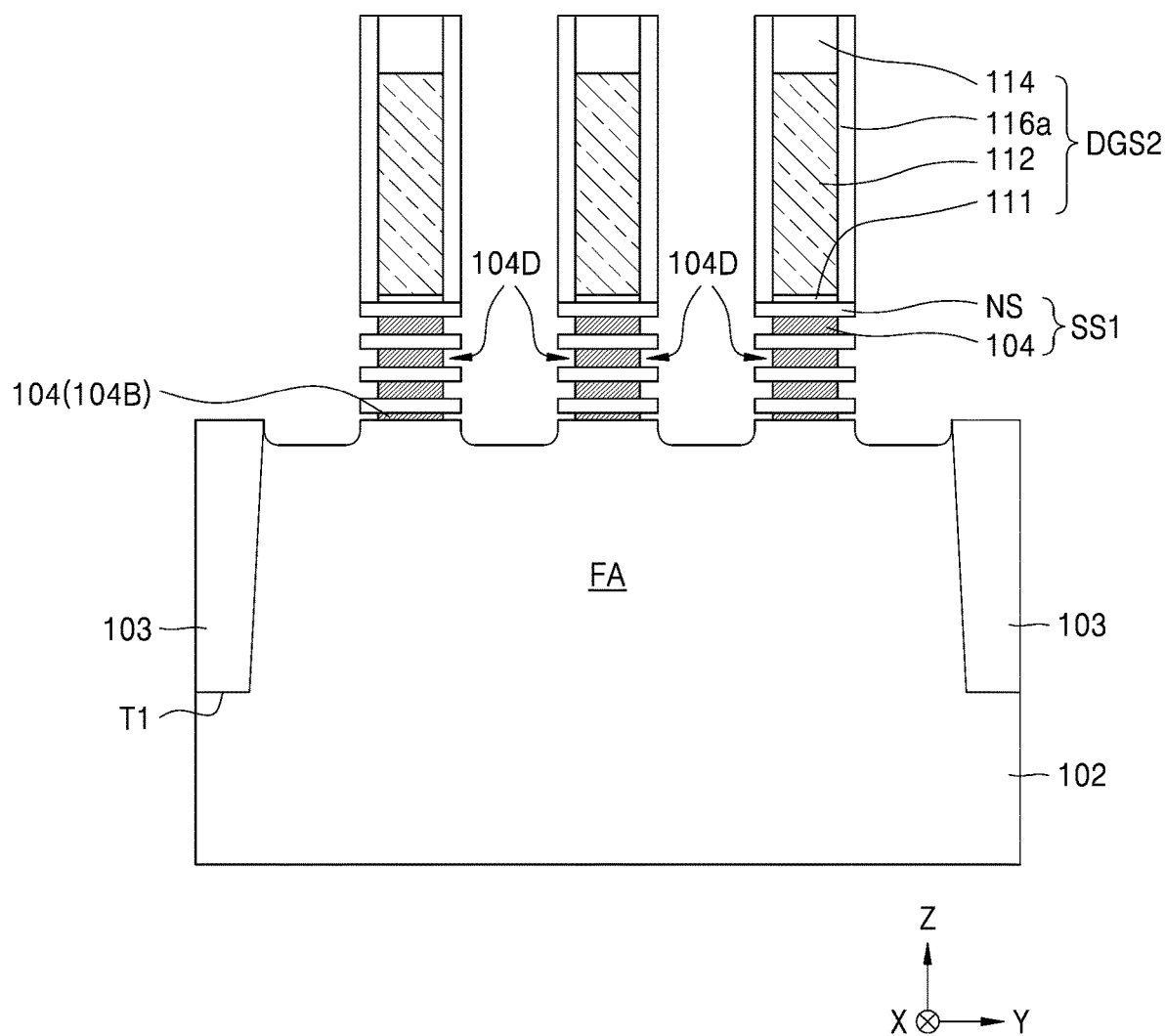

Referring to FIG. 10, the sacrificial semiconductor layer 104 opened on the sides of each of the stack structures SS1 is partially removed using an isotropic etching process to form an indent region 104D between the nanosheets NS. A height of the indent region 104D closest to the fin FA in a third direction (Z direction) may be less than a height of the other indent regions 104D in the third direction (Z direction). In some embodiments, in the isotropic etching process of forming the indent region 104D, a difference in selectivity between the sacrificial semiconductor layer 104 and the nanosheet NS may be used. The isotropic etching process may be performed by a wet method or a dry method.

Figure 11:
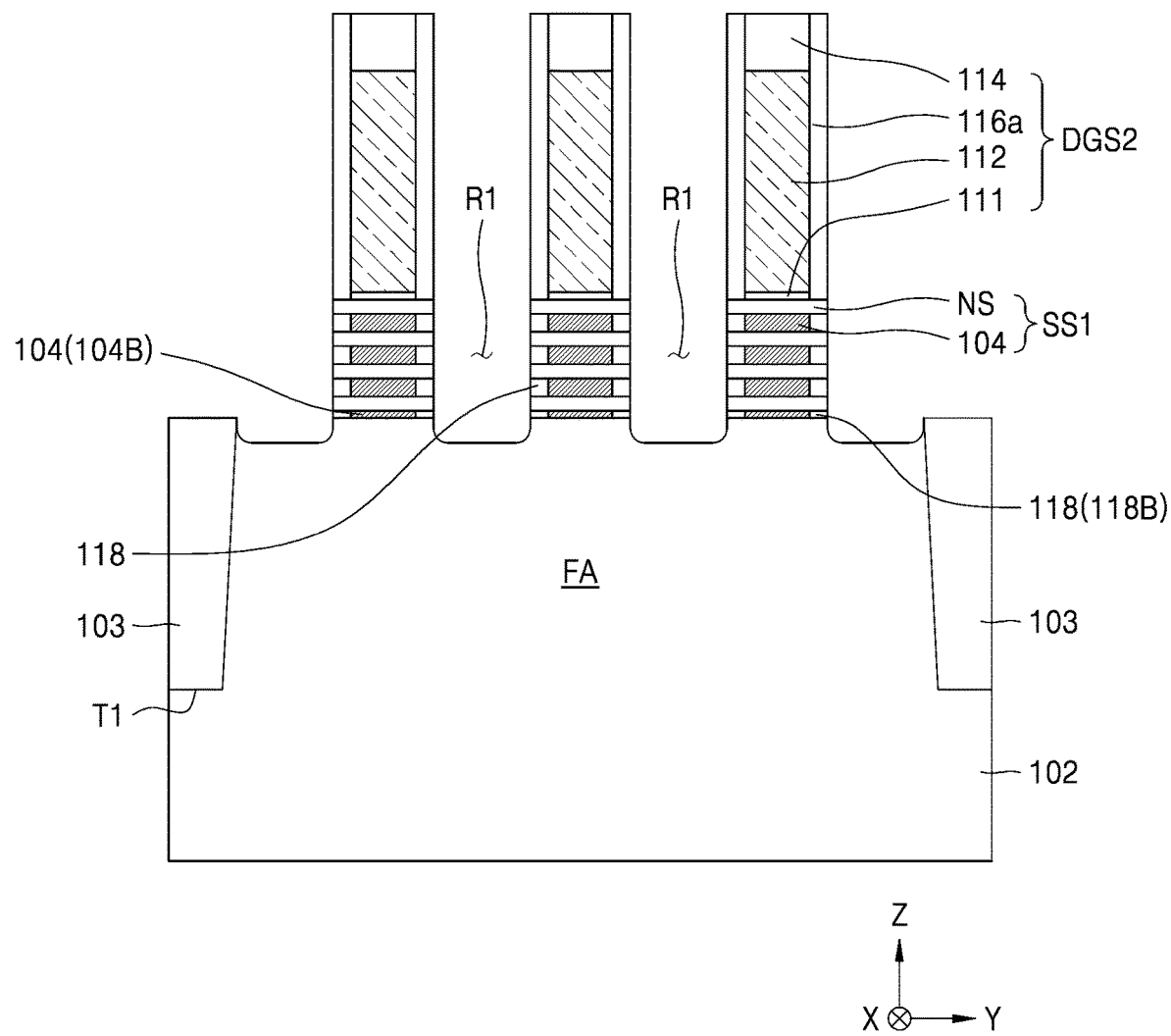

Referring to FIG. 11, a plurality of inter-sheet spacers 118 respectively filled in the plurality of indent regions 104D are formed. A height of the inter-sheet spacer 118B closest to the fin FA in the third direction (Z direction) may be less than a height of the other inter-sheet spacers 118B in the third direction (Z direction). The inter-sheet spacer 118 may be formed through an atomic layer deposition (ALD) process, a CVD process, an oxidation process, or a combination thereof.

Figure 12:
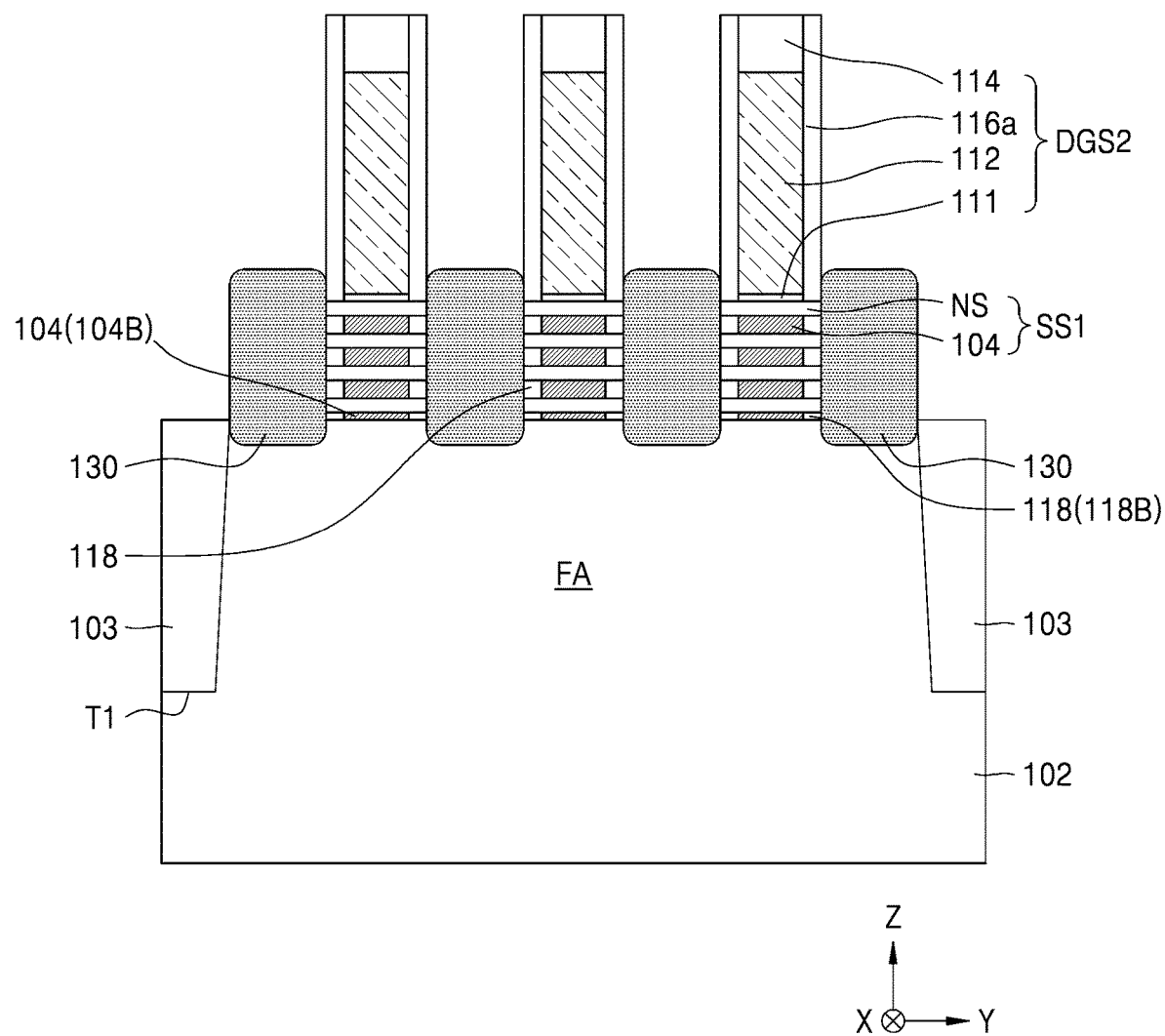

Referring to FIG. 12, a plurality of source/drain regions 130 are formed by epitaxially growing a semiconductor material from both opened sidewalls of each of the nanosheets NS and opened surfaces of the fin FA. As described above, when a region on the substrate 102 is an NMOS region A, the source/drain regions 130 may include boron (B) ions as impurities. In addition, when the region on the substrate 102 is a PMOS region B, the source/drain regions 130 may include phosphorus (P) or arsenic (As) ions as impurities.

Figure 13:
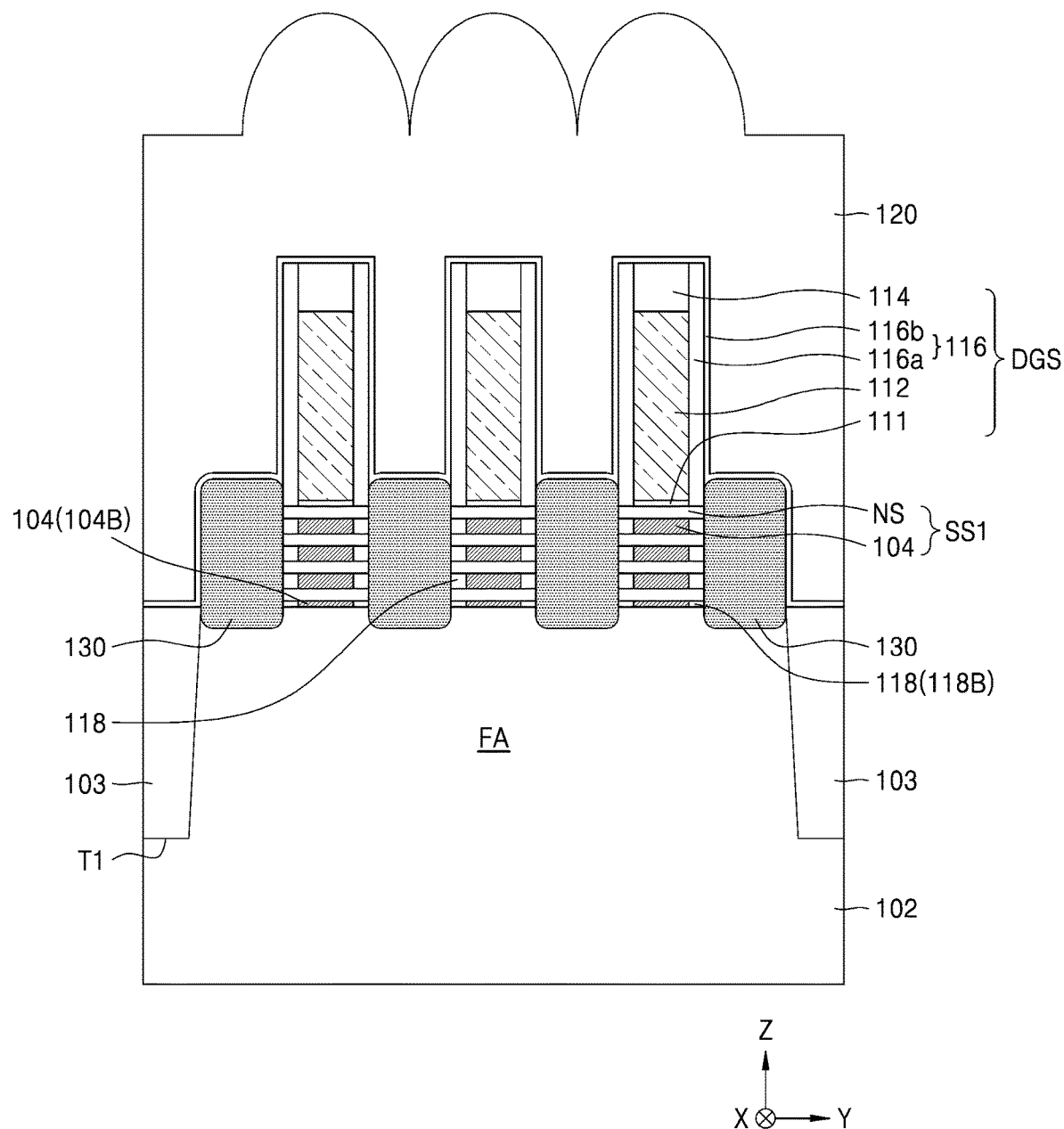

Referring to FIG. 13, a protective insulating layer 116b covering a resultant having the plurality of source/drain regions 130 formed thereon is formed, and the interlayer insulating layer 120 is formed on the protective insulating layer 116b. The dummy gate structure DGS may include an insulating layer 111, a dummy gate 112, a mask pattern 114, and a spacer 116. In the dummy gate structure DGS, the first spacer 116a and the protective insulating layer 116b may form the spacer 116.

Figure 14:
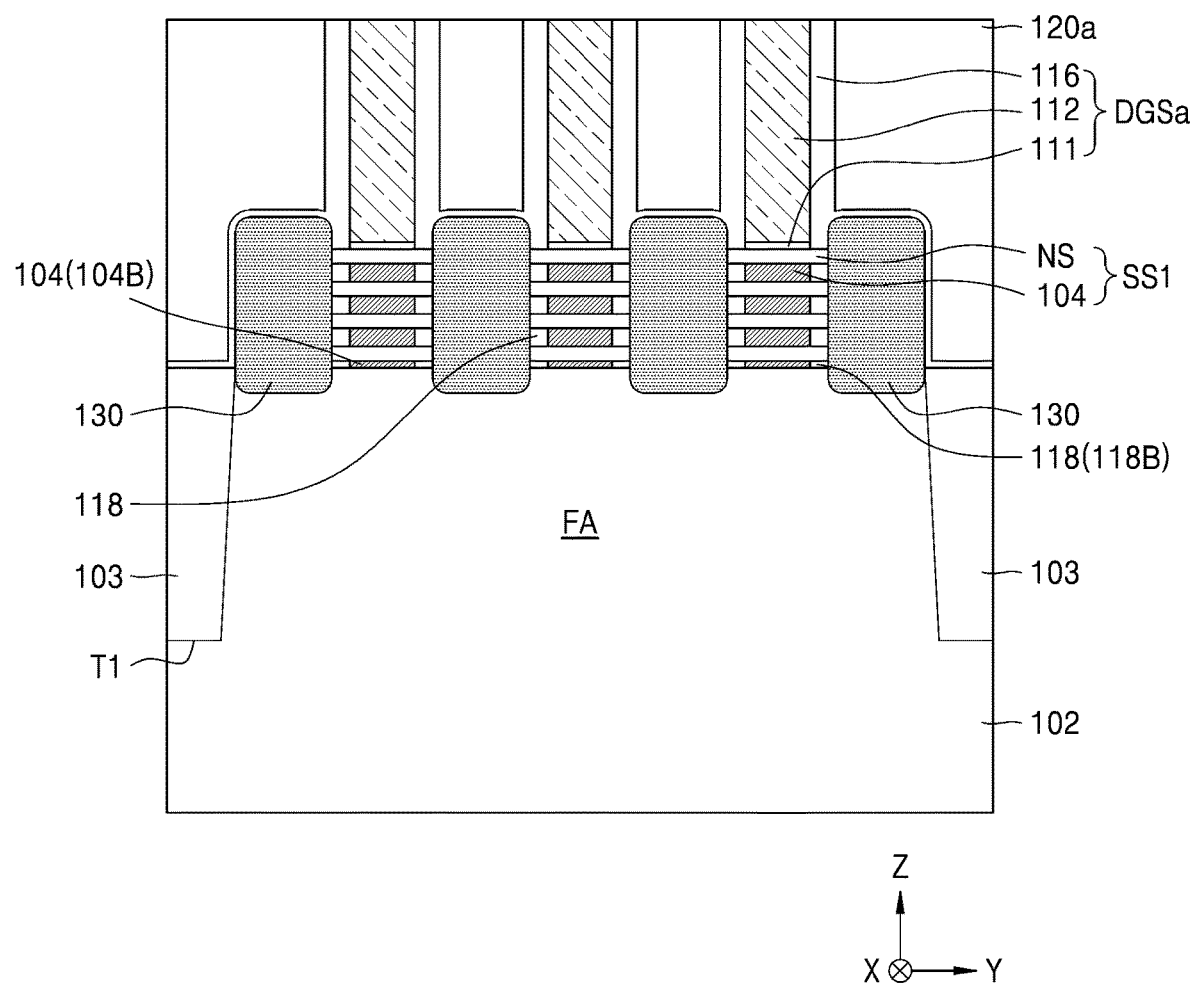

Referring to FIG. 14, with respect to the resultant of FIG. 13, a part of the interlayer insulating layer 120 and the mask pattern 114 are removed through a single slurry CMP process to open the upper surface of the dummy gate 112. The single slurry CMP process is the same as described with reference to FIGS. 4A and 4B. After the single slurry CMP process, the upper surface of the interlayer insulating layer 120a, the upper surface of the spacer 116, and the upper surface of the dummy gate 112 may be coplanar with each other. The dummy gate structure DGSa may include the insulating layer 111, the dummy gate 112, and the spacer 116. In addition, as described above, in order to open all the dummy gates 112, excess polishing may be performed during the single slurry CMP process. Excess polishing is the same as described with reference to FIGS. 4A and 4B.

Figure 15A:
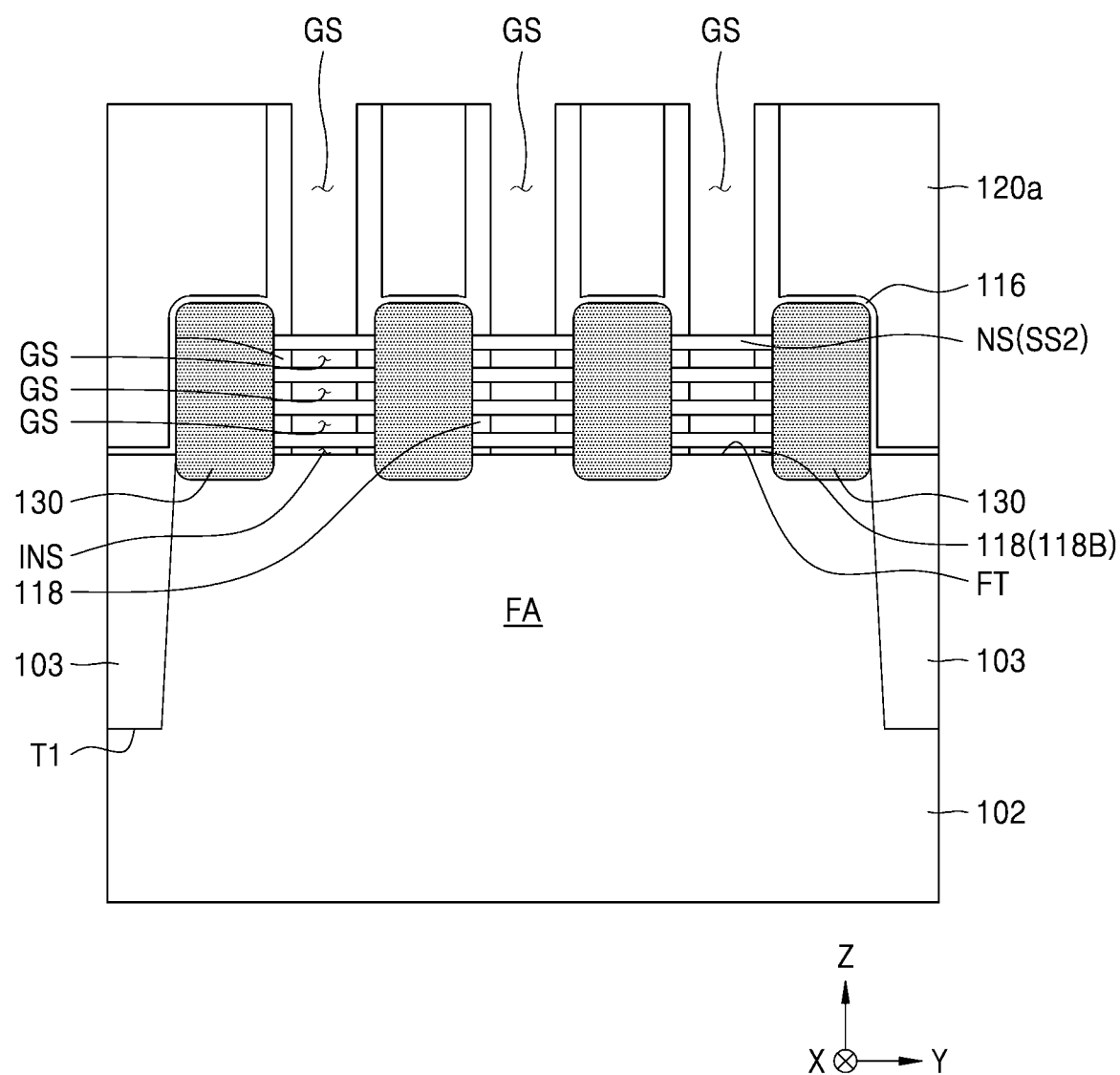
Figure 15B:
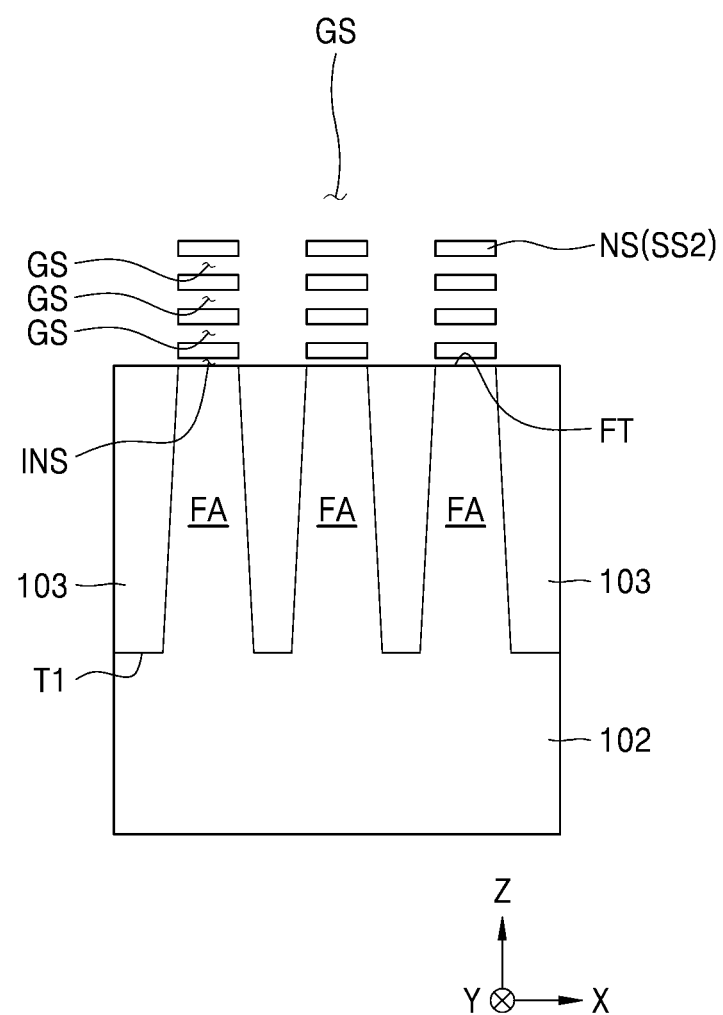

Referring to FIGS. 15A and 15B, the dummy gate 112 and the insulating layer 111 therebelow are removed from the resultant of FIG. 14 to form a gate space GS, and the nanosheet NS is opened through the gate space GS. Subsequently, the sacrificial semiconductor layer 104 remaining on the fin FA is removed through the gate space GS so that the gate space GS expands between the nanosheets NS. The nanosheet NS may be opened through the expanded gate space GS. A stack structure SS2 may include only the nanosheets NS. Meanwhile, an insulating space INS may be formed between the bottom surface of the lowermost nanosheet NS and the upper surface FT of the fin FA.

Figure 16A:
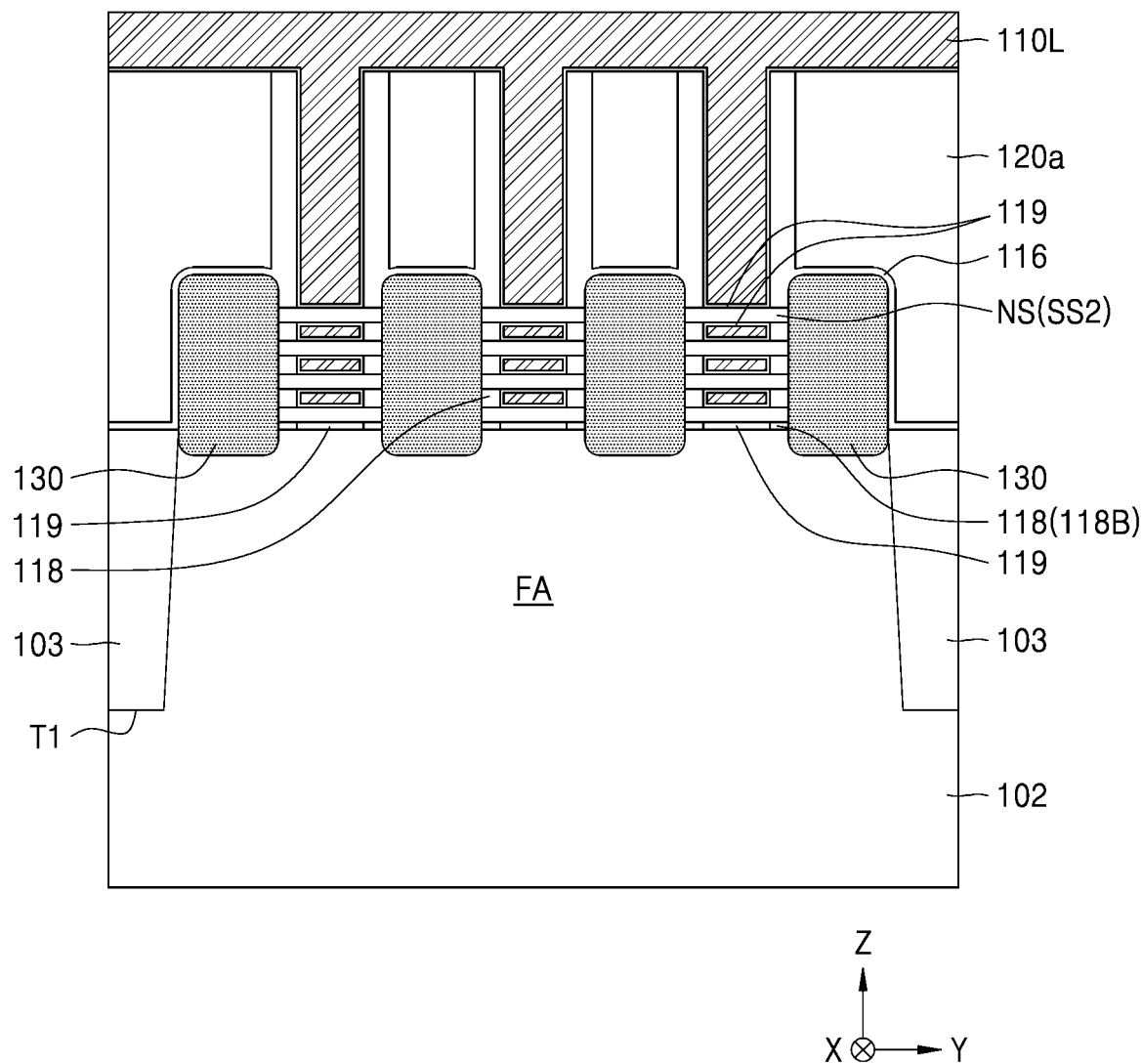
Figure 16B:
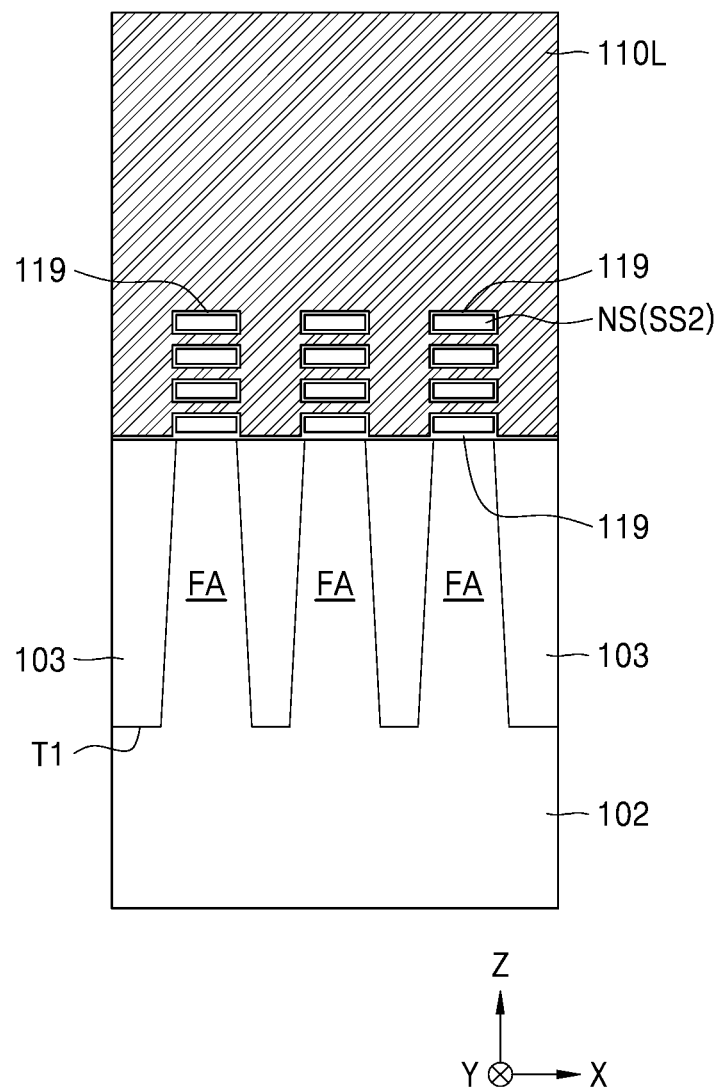

Referring to FIGS. 16A and 16B, a gate dielectric layer 119 covering the opened surfaces of the nanosheet NS and the fin FA is formed. The gate dielectric layer 119 may be formed through an ALD process.

When a distance between the upper surface FT of the fin FA and the lowermost nanosheet NS in the third direction (Z direction) is equal to or less than ½ of a distance between the nanosheets NS in the third direction (Z direction), while the gate dielectric layer 119 is formed in a space between the nanosheets NS, a space between the upper surface FT of the fin FA and the lowermost nanosheet NS may be filled with the gate dielectric layer 119.

Subsequently, a conductive layer 110L for forming a metal gate is formed on the gate dielectric layer 119 to cover an upper surface of the interlayer insulating layer 120a while filling the gate space GS. The conductive layer 110L for forming the metal gate may include a metal, a metal nitride, a metal carbide, or a combination thereof. The conductive layer 110L for forming the metal gate may be formed through an ALD process.

Figure 17A:
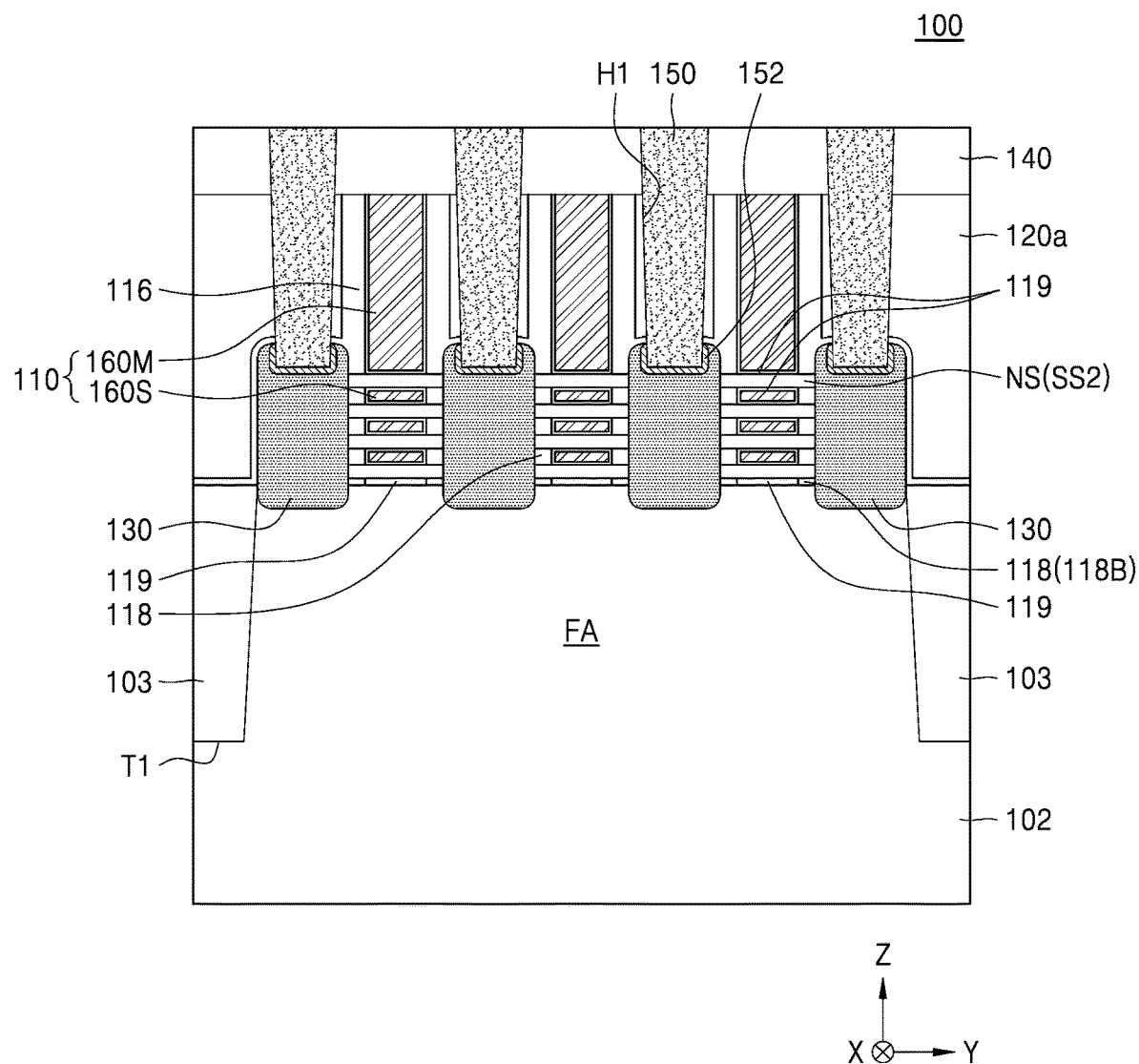
Figure 17B:
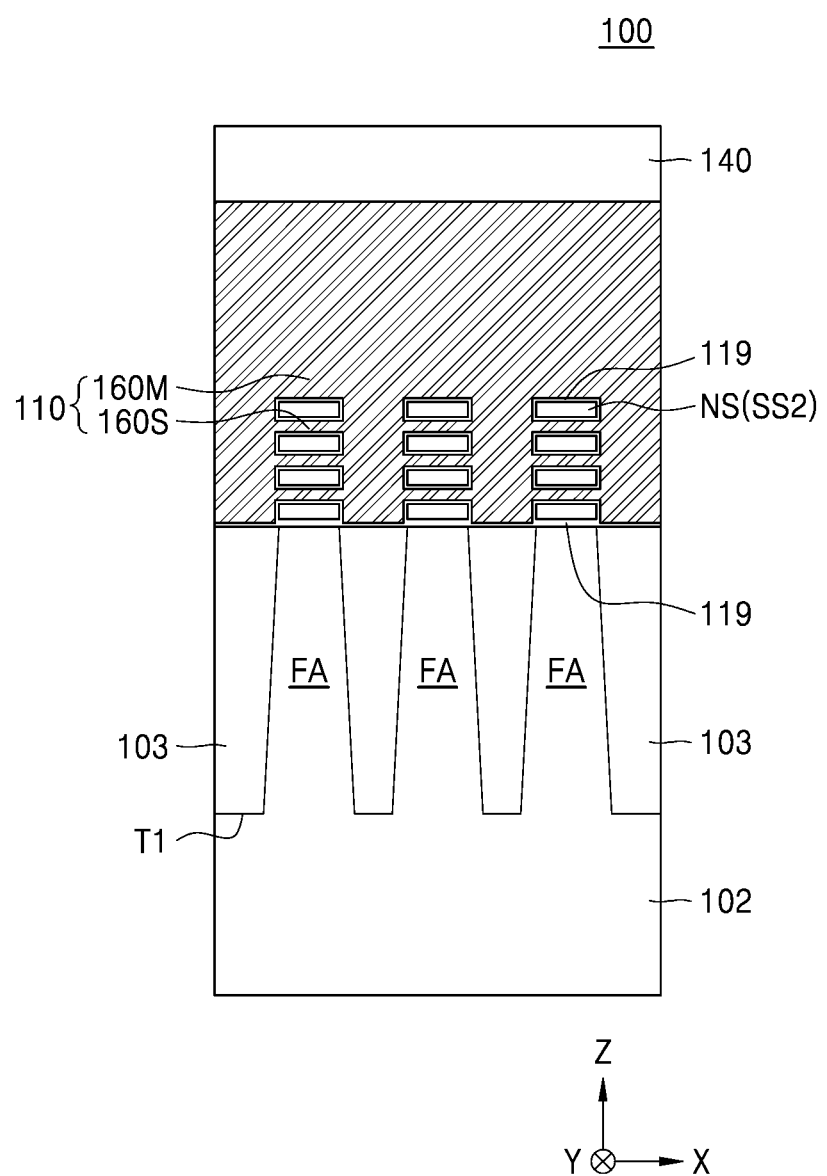

Referring to FIGS. 17A and 17B, so that the upper surface of the interlayer insulating layer 120a is opened in the resultant of FIGS. 16A and 16B, a part of an upper portion of the conductive layer 110L for forming the metal gate is removed to form the metal gate 110. The metal gate 110 may include a main gate 110M and a sub gate 110S. Because the space between the fin FA and the lowermost nanosheet NS is filled with the gate dielectric layer 119, the metal gate 110 may not extend to the space between the upper surface FT of the fin FA and the lowermost nanosheet NS. As a planarization process is performed while the metal gate 110 is formed, heights of the spacer 116 and the interlayer insulating layer 120a may be lowered.

Subsequently, after forming an upper interlayer insulating layer 140 covering the metal gate 110, the upper interlayer insulating layer 140 and the interlayer insulating layer 120a are partially etched to form a contact hole H1 that opens the source/drain regions 130. A metal silicide layer 152 is formed on an upper surface of each of the source/drain regions 130 opened through the contact hole H1. Thereafter, a semiconductor device 100 may be formed by forming a contact plug 150 filled in the contact hole H1 on the metal silicide layer 152. Here, the semiconductor device 100 may be a nanosheet FET. Meanwhile, the nanosheet FET has a structure in which the metal gate 110 surrounds four surfaces of the nanosheet NS, and thus may correspond to a GAAFET.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor device using a single slurry chemical mechanical polishing (CMP) process, the method comprising:
    forming, on a substrate, dummy gate structures extending away from the substrate in a first direction and spaced apart from each other in a second direction perpendicular to the first direction, each dummy gate structure comprising a dummy gate and a mask pattern on an upper surface of the dummy gate;
    forming an interlayer insulating layer covering the dummy gate structures; and
    performing the single slurry CMP process of removing upper portions of the interlayer insulating layer and the dummy gate structures through the single slurry CMP process, thereby exposing the upper surface of the dummy gate,
    wherein, before the performing of the single slurry CMP process, a maximum thickness of the mask pattern is equal to or less than 85 nm, and
    in the performing of the single slurry CMP process, one type of slurry composition in which a selectivity of the mask pattern to the interlayer insulating layer is 1 to 2, and a selectivity of the interlayer insulating layer or the mask pattern to the dummy gate is equal to or greater than 50 is used, wherein the performing of the single slurry CMP process comprises:
    performing a first process of removing an upper portion of the interlayer insulating layer in a first chamber among three chambers;
    performing a second process of exposing an upper surface of the mask pattern having the maximum thickness in a second chamber among the three chambers; and
    performing a third process of exposing the upper surface of the dummy gate in a third chamber among the three chambers, wherein the single slurry composition is used in the first process, the second process, and the third process.

2. The method of claim 1, wherein, after the performing of the single slurry CMP process, the upper surface of the dummy gate and an upper surface of the interlayer insulating layer are substantially coplanar.

3. The method of claim 1,
    wherein each of the dummy gate structures further comprises a spacer covering opposing side surfaces of the dummy gate and the mask pattern and
    in the performing of the single slurry CMP process, the mask pattern and a portion of the spacer covering the mask pattern are removed.

4. The method of claim 1, wherein a selectivity of the mask pattern to the interlayer insulating layer with respect to the slurry composition is substantially 1.

5. The method of claim 1,
    wherein the interlayer insulating layer comprises silicon oxide ($SiO_2$),
    the mask pattern comprises silicon nitride (SiNx), and
    the dummy gate comprises polysilicon.

6. The method of claim 1,
    wherein an NMOS region, a PMOS region and an overlap region between the NMOS region and the PMOS region are defined on the substrate and spaced apart in the second direction,
    a first dummy gate structure among the dummy gate structures is disposed in the NMOS region,
    a second dummy gate structure among the dummy gate structures is disposed in the PMOS region,
    a third dummy gate structure among the dummy gate structures is disposed in the overlap region,
    the mask pattern comprises a first mask pattern of the first dummy gate structure, a second mask pattern of the second dummy gate structure, and a third mask pattern of the third dummy gate structure, and
    before the performing of the single slurry CMP process, the first mask pattern has a thickness that is less than a thickness of the third mask pattern, and the second mask pattern has a thickness that is greater than a thickness of the first mask pattern and less than a thickness of the third mask pattern.

7. The method of claim 6,
    wherein, before the performing of the single slurry CMP process,
    the thickness of the first mask pattern is equal to or less than 30 nm, and
    a thickness difference between the first mask pattern and the third mask pattern is equal to or greater than 50 nm.

8. The method of claim 1, further comprising:
    before the forming of the dummy gate structures,
    forming, on the substrate, fins extending in the second direction and spaced apart from each other in the first direction, the fins comprising a stack structure in which a sacrificial semiconductor layer and a nanosheet are alternately stacked thereon;

before the forming of the interlayer insulating layer, removing a portion of the stack structure on side surfaces of each of the dummy gate structures and forming source and drain regions, wherein the side surfaces of each of the dummy gate structures are spaced apart from each other in the second direction; and after the performing of the single slurry CMP process, replacing the dummy gate and the sacrificial semiconductor layer with a metal gate.

9. The method of claim 8, wherein the semiconductor device comprises a gate all around FET (GAAFET) comprising the metal gate that surrounds the nanosheet.

10. The method of claim 1, wherein, in the performing of the single slurry CMP process, excess polishing is further performed for a set time after the upper surface of the dummy gate is exposed.

11. A method of manufacturing a semiconductor device using a single slurry chemical mechanical polishing (CMP) process, the method comprising:

forming a plurality of fins on a substrate;

forming dummy gate structures extending in a first direction away from the substrate across the plurality of fins on the substrate and spaced apart from each other in a second direction perpendicular to the first direction, each dummy gate structure comprising a dummy gate and a mask pattern on an upper surface of the dummy gate;

forming source and drain regions on side surfaces of each of the dummy gate structures in the second direction;

forming an interlayer insulating layer covering the dummy gate structures;

performing the single slurry CMP process of removing upper portions of the interlayer insulating layer and the dummy gate structures through the single slurry CMP process and, thereby exposing the upper surface of the dummy gate, the single slurry CMP process using a single slurry composition; and replacing the dummy gate with a metal gate, wherein, in the forming of the plurality of fins, a stack structure in which a sacrificial semiconductor layer and a nanosheet are alternately stacked on each of the plurality of fins is formed, in the replacing the dummy gate with the metal gate, the sacrificial semiconductor layer is also replaced with the metal gate, and the semiconductor device comprises a gate all around FET (GAAFET) comprising the metal gate that surrounds the nanosheet, and wherein an NMOS region, a PMOS region and an overlap region between the NMOS region and the PMOS region are defined on the substrate and are spaced apart from each other;

a first dummy gate structure among the dummy gate structures is disposed in the NMOS region, a second dummy gate structure among the dummy gate structures is disposed in the PMOS region, a third dummy gate structure among the dummy gate structures is disposed in the overlap region, the mask pattern comprises a first mask pattern of the first dummy gate structure, a second mask pattern of the second dummy gate structure, and a third mask pattern of the third dummy gate structure, and before the performing of the single slurry CMP process, a thickness of the first mask pattern has a thickness that is less than a thickness of the third mask pattern, and the second mask pattern has a thickness that is greater than a thickness of the first mask pattern and less than a thickness of the third mask pattern.

12. The method of claim 11, wherein, with respect to the slurry composition, a selectivity of the mask pattern to the interlayer insulating layer is substantially 1, and a selectivity of the interlayer insulating layer or the mask pattern to the dummy gate is equal to or greater than 50.

13. The method of claim 11, wherein before the performing of the single slurry CMP process, a thickness of the first mask pattern is equal to or less than 30 nm, a thickness of the third mask pattern is equal to or less than 85 nm, and a thickness difference between the first mask pattern and the third mask pattern is equal to or greater than 50 nm.

14. The method of claim 11, wherein the performing of the single slurry CMP process comprises:

performing a first process of removing the upper portion of the interlayer insulating layer in a first chamber among three chambers;

performing a second process of exposing an upper surface of the mask pattern having a maximum thickness in a second chamber among the three chambers; and performing a third process of exposing the upper surface of the dummy gate in a third chamber among the three chambers.

15. A method of manufacturing a semiconductor device using a single slurry chemical mechanical polishing (CMP) process, the method comprising:

forming, on a substrate, dummy gate structures extending away from the substrate in a first direction and spaced apart from each other in a second direction perpendicular to the first direction, each dummy gate structure comprising a dummy gate and a mask pattern on an upper surface of the dummy gate;

forming an interlayer insulating layer covering the dummy gate structures; and performing a single slurry CMP process of removing an upper portion of the interlayer insulating layer and upper portions of the dummy gate structures through the single slurry CMP process and, thereby exposing the upper surface of the dummy gate, wherein the single slurry CMP process is performed in three chambers, and a single slurry composition is used in the three chambers, wherein an NMOS region, a PMOS region and an overlap region between the NMOS region and the PMOS region are defined on the substrate in the second direction, a first dummy gate structure among the dummy gate structures is disposed in the NMOS region;

a second dummy gate structure among the dummy gate structures is disposed in the PMOS region, a third dummy gate structure among the dummy gate structures is disposed in the overlap region, and the mask pattern comprises a first mask pattern of the first dummy gate structure, a second mask pattern of the second dummy gate structure, and a third mask pattern of the third dummy gate structure, and before the performing of the single slurry CMP process, a thickness of the first mask pattern is equal to or less than 30 nm, a thickness of the third mask pattern is equal to or less than 85 nm, and a thickness difference between the first mask pattern and the third mask pattern is equal to or greater than 50 nm.

16. The method of claim 15,
wherein the performing of the single slurry CMP process comprises:
performing a first process of removing an upper portion of the interlayer insulating layer in a first chamber among three chambers;
performing a second process of exposing an upper surface of the mask pattern having a maximum thickness in a second chamber among the three chambers; and
performing a third process of exposing the upper surface of the dummy gate in a third chamber among the three chambers.

17. The method of claim 15, further comprising: after the performing of the single slurry CMP process, replacing the dummy gate with a metal gate,
wherein the semiconductor device includes a gate all around FET (GAAFET) comprising the metal gate that surrounds a channel region.

\* \* \* \* \*